(12) United States Patent
Goto

(10) Patent No.: US 10,402,968 B2
(45) Date of Patent: Sep. 3, 2019

(54) IMAGE PROCESSING DEVICE, MEDICAL DEVICE, AND PROGRAM

(71) Applicant: General Electric Company, Schenectady, NY (US)

(72) Inventor: Takao Goto, Hino (JP)

(73) Assignee: General Electric Company, Schenectady, NY (US)

( * ) Notice: Subject to any disclaimer, the term of this patent is extended or adjusted under 35 U.S.C. 154(b) by 239 days.

(21) Appl. No.: 15/380,380

(22) Filed: Dec. 15, 2016

(65) Prior Publication Data

US 2017/0186158 A1 Jun. 29, 2017

(30) Foreign Application Priority Data

Dec. 25, 2015 (JP) ................................. 2015-254354

(51) Int. Cl.
| | |
|---|---|
| *G06T 7/00* | (2017.01) |
| *G06T 7/73* | (2017.01) |
| *G01R 33/56* | (2006.01) |
| *G01R 33/563* | (2006.01) |

(52) U.S. Cl.
CPC ........ *G06T 7/0012* (2013.01); *G01R 33/5608* (2013.01); *G01R 33/5635* (2013.01); *G06T 7/0016* (2013.01); *G06T 7/75* (2017.01); *G06T 2207/10088* (2013.01); *G06T 2207/30048* (2013.01); *G06T 2207/30092* (2013.01); *G06T 2207/30101* (2013.01); *G06T 2207/30104* (2013.01)

(58) Field of Classification Search
None
See application file for complete search history.

(56) References Cited

U.S. PATENT DOCUMENTS

| | | | |
|---|---|---|---|
| 2010/0119135 A1* | 5/2010 | Coupe | G06K 9/32 382/131 |
| 2013/0266182 A1* | 10/2013 | Shotton | G06K 9/00369 382/103 |
| 2015/0003706 A1* | 1/2015 | Eftestol | G06T 7/0012 382/131 |

* cited by examiner

*Primary Examiner* — Matthew C Bella
*Assistant Examiner* — Brian D Shin

(57) ABSTRACT

An image processing apparatus comprising an image producing unit 101 for producing an axial image of a body part to be imaged including an aorta and an esophagus; a map generating unit 102 for generating a map M2 for locating a region in which a probability that the aorta lies is high in the axial image; a detecting unit 103 for detecting a temporary position of the aorta based on the map M2; and a deciding unit 104 for making a decision on whether or not the temporary position of the aorta falls within the region of the aorta in the axial image based on a distribution model DM containing information representing a reference position ($x_e$, $y_e$) of the esophagus and information representing a range over which the aorta distributes relative to the reference position ($x_e$, $y_e$) of the esophagus, and on the map M2.

13 Claims, 25 Drawing Sheets

Map M1 obtained from axial image D₁

Map M1 obtained from axial image D₁

Region R1 of aorta A

IMAGE PROCESSING DEVICE, MEDICAL DEVICE, AND PROGRAM

CROSS-REFERENCE TO RELATED APPLICATIONS

This application claims priority to Japanese patent application number 2015-254354, filed on Dec. 25, 2015, the entirety of which is incorporated herein by reference.

BACKGROUND

The present invention relates to an image processing apparatus for performing processing of an image, a medical apparatus for performing a scan on a subject, and a program applied to the image processing apparatus.

Magnetic resonance imaging apparatuses for imaging a subject using a contrast medium have been conventionally known.

An example of the method of imaging a subject using a contrast medium is one in which an operator visually finds a position of an aorta from within/among an image/images, and defines a tracker region for detecting the contrast medium at the position of the aorta.

An aorta is detected by increasing the area of a $Z_{dephaser}$ in a slice gradient magnetic field to diminish as much as possible signals from blood in the aorta rendered in an axial image. Blood in the aorta, however, sometimes exhibits high signals in cardiac systole because the blood flow velocity in the aorta lowers then. Therefore, in practice, signals from blood in the aorta sometimes cannot be fully diminished due to an effect of the high-signal blood. This poses a problem that tissue different from the aorta is wrongly detected as an aorta, or the aorta cannot be detected. There is a known technique capable of detecting a position of the aorta even when signals from blood in the aorta are not fully diminished.

However, near the aorta lies an esophagus. Since the esophagus is rendered with relatively low signals, a known method may cause the esophagus lying near the aorta to be wrongly detected as an aorta. When the esophagus is wrongly detected as an aorta, a problem arises that it is difficult to define the tracker region for detecting a contrast medium at a position suitable for contrast-enhanced imaging. Thus, there is a need for a technique capable of, after executing detection processing for detecting a position of a body part of interest, such as the aorta, deciding whether or not the position of the body part of interest has been correctly detected.

SUMMARY

The present invention, in its first aspect, is an image processing apparatus comprising an image producing unit for producing an image of a body part to be imaged including a first body part and a second body part of a subject; a map generating unit for generating a first map for locating a region in which a probability that said first body part lies is high in said image; a unit for determining a temporary position of said first body part based on said first map; and a deciding unit for making a decision on whether or not the temporary position of said first body part falls within the region of said first body part in said image based on a model containing information representing a reference position of said second body part and information representing a range over which said first body part distributes relative to said reference position, and on said first map.

The present invention, in its second aspect, is a medical apparatus comprising a scanning section for performing a scan for obtaining data of a body part to be imaged including a first body part and a second body part of a subject; an image producing unit for producing an image of said body part to be imaged based on the data obtained by said scan; a map generating unit for generating a first map for locating a region in which a probability that said first body part lies is high in said image; a unit for determining a temporary position of said first body part based on said first map; and a deciding unit for making a decision on whether or not the temporary position of said first body part falls within the region of said first body part in said image based on a model containing information representing a reference position of said second body part and information representing a range over which said first body part distributes relative to said reference position, and on said first map.

The present invention, in its third aspect, is a program for causing a computer to execute an image producing processing of producing an image of a body part to be imaged including a first body part and a second body part of a subject; a map generating processing of generating a first map for locating a region in which a probability that said first body part lies is high in said image; a processing of determining a temporary position of said first body part based on said first map; and a deciding processing of making a decision on whether or not the temporary position of said first body part falls within the region of said first body part in said image based on a model containing information representing a reference position of said second body part and information representing a range over which said first body part distributes relative to said reference position, and on said first map.

By using a model containing information representing a reference position of the second body part and information representing a range over which the first body part distributes relative to the reference position, a decision may be made on whether or not a temporary position of the first body part falls within a region of the first body part in an image.

DETAILED DESCRIPTION

Now embodiments for practicing the invention will be described hereinbelow, although the present invention is not limited thereto.

Figure 1:
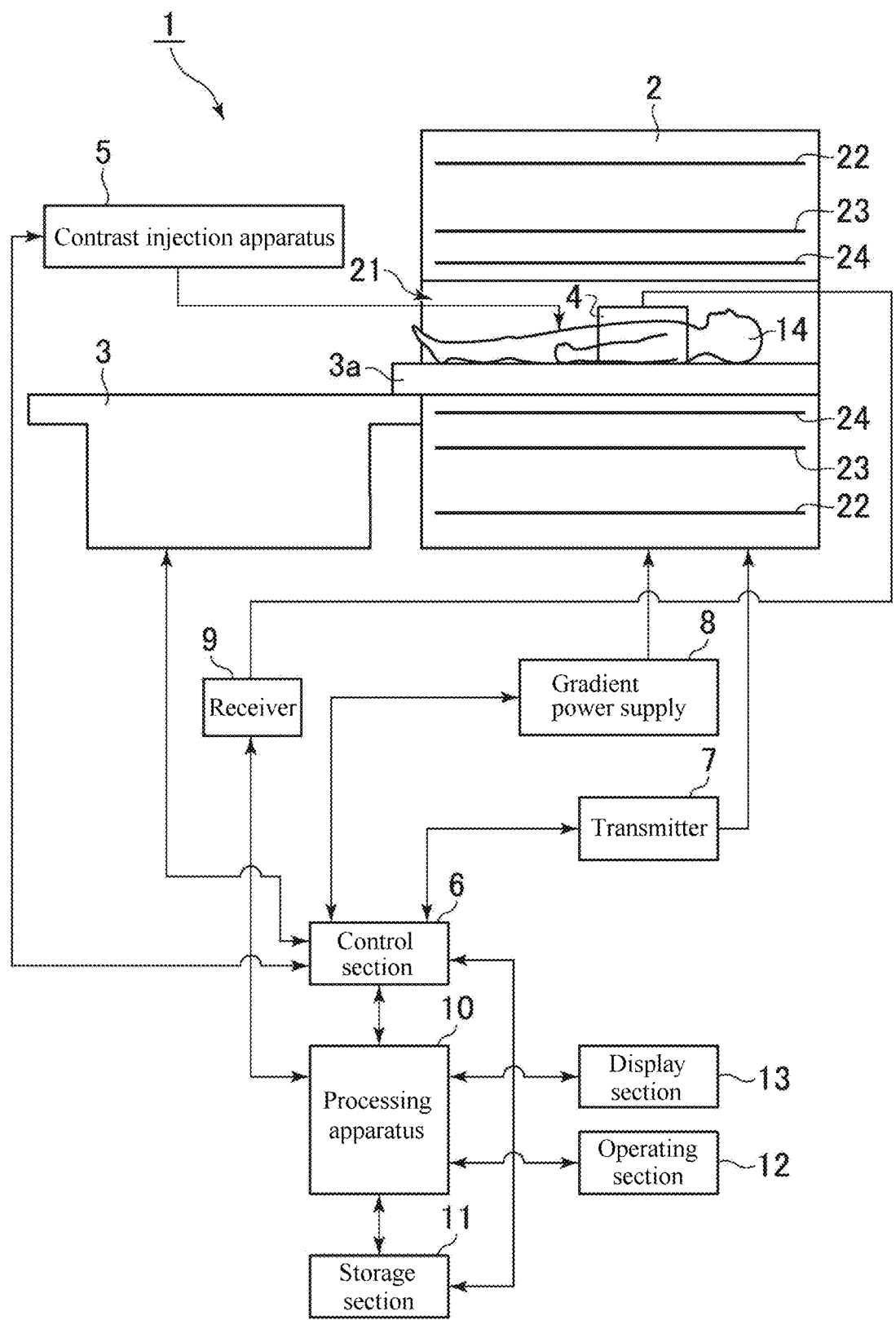
FIG. 1 is a schematic diagram of a magnetic resonance apparatus in one embodiment of the present invention.

FIG. 1 is a schematic diagram of a magnetic resonance apparatus in one embodiment of the present invention. The magnetic resonance apparatus (referred to as "MR apparatus" hereinbelow) 100 comprises a magnet 2, a table 3, a receive coil 4, and a contrast injection apparatus 5.

The magnet 2 has a reception space 21 in which a subject 14 is received. Moreover, the magnet 2 has a superconductive coil 22, a gradient coil 23, and an RF coil 24. The superconductive coil 22 applies a static magnetic field, the gradient coil 23 applies a gradient pulse, and the RF coil 24 applies an RF pulse. A permanent magnet may be employed in place of the superconductive coil 22.

The table 3 has a cradle 3a for carrying the subject 14. It is by the cradle 3a that the subject 14 is carried into the reception space 21.

The receive coil 4 is attached to the subject 14. The receive coil 4 receives magnetic resonance signals from the subject 14. The contrast injection apparatus 5 injects a contrast medium into the subject 14.

The MR apparatus 1 further comprises a control section 6, a transmitter 7, a gradient power supply 8, a receiver 9, a processing apparatus 10, a storage section 11, an operating section 12, and a display section 13.

The control section 6 receives from the processing apparatus 10 data containing waveform information, the time for application, etc. of the RF pulse and gradient pulse used in a sequence. The control section 6 then controls the transmitter 7 based on the data for the RF pulse, and controls the gradient power supply 8 based on the data for the gradient pulse. The control section 6 also performs control of the start time for injection of the contrast medium in the contrast injection apparatus 5, control of movement of the cradle 3a, etc. While the control section 6 performs control of the contrast injection apparatus 5, transmitter 7, gradient power supply 8, cradle 3a, etc. in FIG. 1, the control of the contrast injection apparatus 5, transmitter 7, gradient power supply 8, cradle 3a, etc. may be performed by a plurality of control sections. For example, there may be separately provided a control section for controlling the contrast injection apparatus 5, that for controlling the transmitter 7 and gradient power supply 8, and that for controlling the cradle 3a.

The transmitter 7 supplies electric current to the RF coil 24 based on the data received from the control section 6. The gradient power supply 8 supplies electric current to the gradient coil 23 based on the data received from the control section 6.

The receiver 9 applies processing, such as demodulation/detection, to magnetic resonance signals received by the receive coil 4, and outputs the resulting signals to the processing apparatus 10. It should be noted that a combination of the magnet 2, receive coil 4, control section 6, transmitter 7, gradient power supply 8, and receiver 9 constitute the scanning section.

Figure 2:
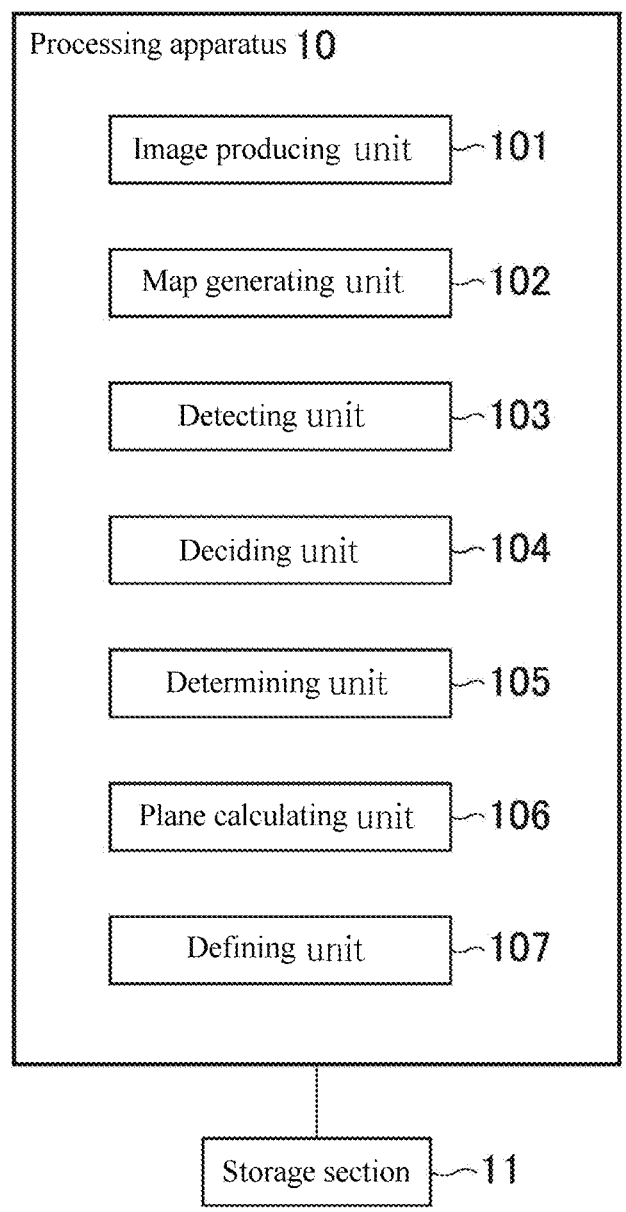
FIG. 2 is a diagram explaining units the processing apparatus 10 implements.

The storage section 11 stores therein programs executed by the processing apparatus 10, and the like. The storage section 11 may be a non-transitory storage medium, such as a hard disk or CD-ROM. The processing apparatus 10 loads a program stored in the storage section 11, and operates as a processor executing processing written in the program. By executing processing written in the program, the processing apparatus 10 implements several kinds of units. FIG. 2 is a diagram explaining the units the processing apparatus 10 implements.

Image producing unit 101 produces an image of a body part to be imaged in the subject 14. Map generating unit 102 generates a map for locating a region in which a probability that an aorta lies is high in an image produced by the image producing unit 101. Detecting unit 103 detects a temporary position of the aorta based on the map. Deciding unit 104 decides whether or not the temporary position of the aorta falls within the region of the aorta. Determining unit 105 determines a position of the aorta. Plane calculating unit 106 calculates a plane longitudinally cutting the aorta. Defining unit 107 defines a tracker region for detecting the contrast medium based on information input from the operating section 12.

The MR apparatus 1 comprises a computer including the processing apparatus 10. The processing apparatus 10 implements the image producing unit 101 to defining unit 106, etc. by loading programs stored in the storage section 11. The processing apparatus 10 may implement the image producing unit 101 to defining unit 106 by a single processor, or by two or more processors. Moreover, some of the image producing unit 101 to defining unit 106 may be executed by the control section 6. The programs executed by the processing apparatus 10 may be stored in a single storage section, or separately in a plurality of storage sections. The processing apparatus 10 constitutes the image processing apparatus. Referring back to FIG. 1, the description will be continued.

The operating section 12 is operated by an operator to input several kinds of information to the computer 8. The display section 13 displays several kinds of information. The MR apparatus 1 is configured as described above.

Figure 3:
FIG. 3 is a diagram showing scans performed in the present embodiment.
Figure 4:
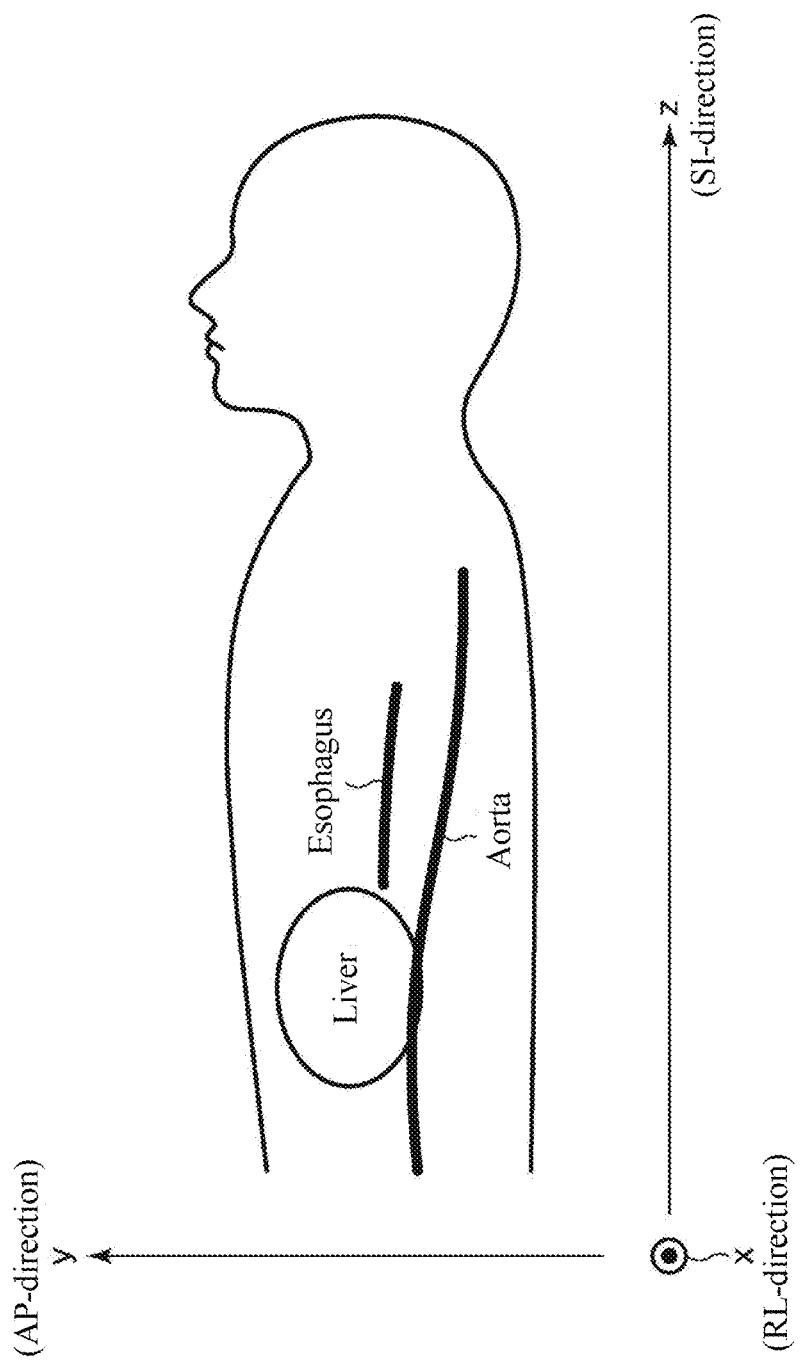
FIG. 4 is a diagram schematically showing a body part to be imaged.

FIG. 3 is a diagram showing scans performed in the present embodiment, and FIG. 4 is a diagram schematically showing a body part to be imaged. In FIG. 4, an x-axis direction, a y-axis direction, and a z-axis direction correspond to an RL (Right-Left) direction, an AP (Anterior- Posterior) direction, and an SI (Superior-Inferior) direction, respectively. In the present embodiment, a localizer scan LS, a main scan MS, etc. are performed.

The localizer scan LS is a scan for defining a range to be imaged and obtaining an image used for detecting an aorta. Subsequent to the localizer scan LS, the main scan MS is performed.

In the main scan MS, a contrast medium is injected into the subject, and a sequence for detecting the contrast medium from a tracker region (see FIG. 25), which will be discussed later, is repetitively performed. Once a predetermined amount of the contrast medium has been injected into the tracker region, an imaging sequence for obtaining an image of the liver is performed. Now an exemplary flow in performing the localizer scan LS and main scan MS will be described below.

Figure 5:
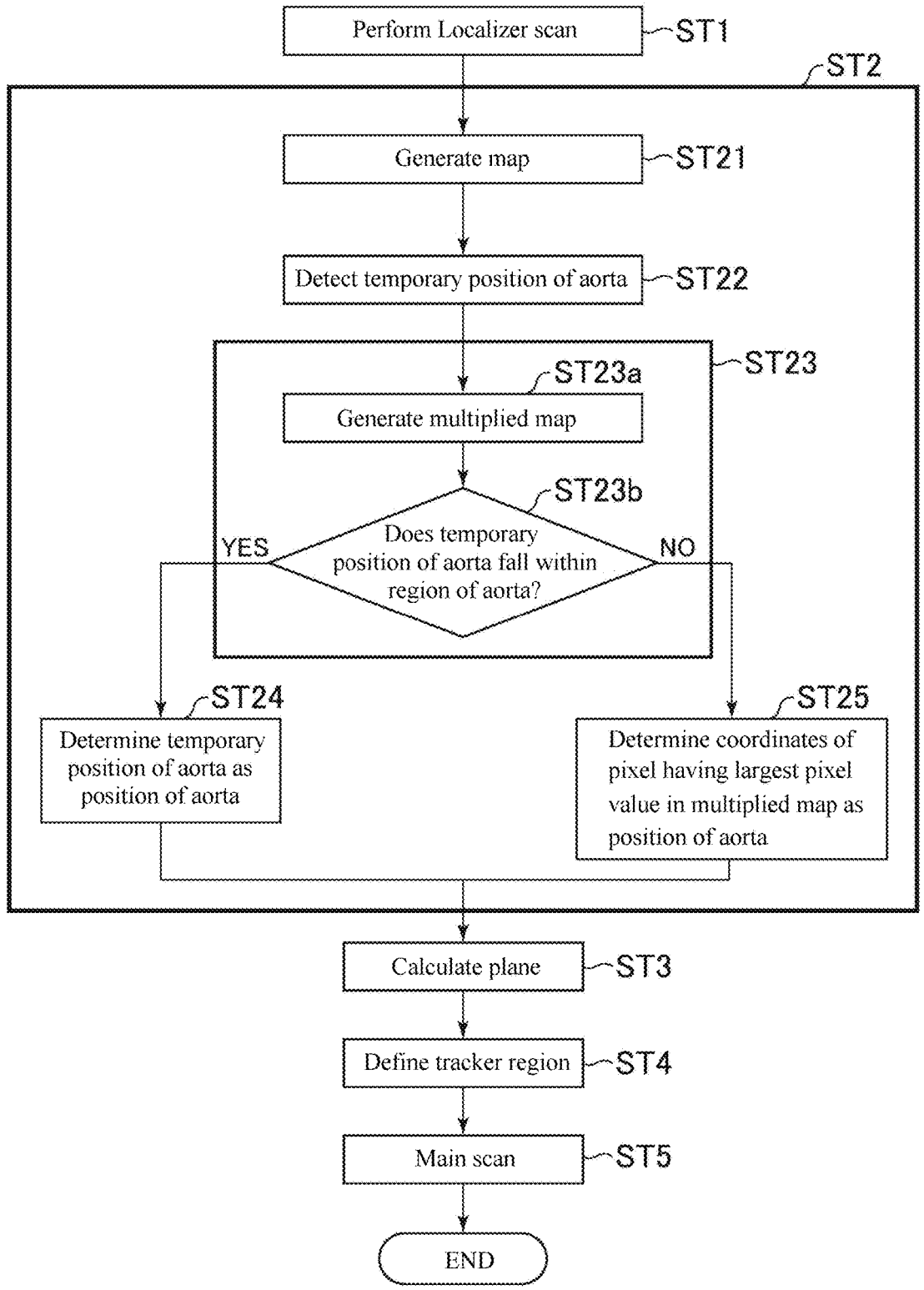
FIG. 5 is a diagram showing an exemplary flow representing several steps of processing in imaging a subject in the present embodiment.

FIG. 5 is diagram showing an exemplary flow representing several steps of processing in imaging the subject in the present embodiment. At Step ST1, a localizer scan LS (see FIG. 3) is performed.

Figure 6:
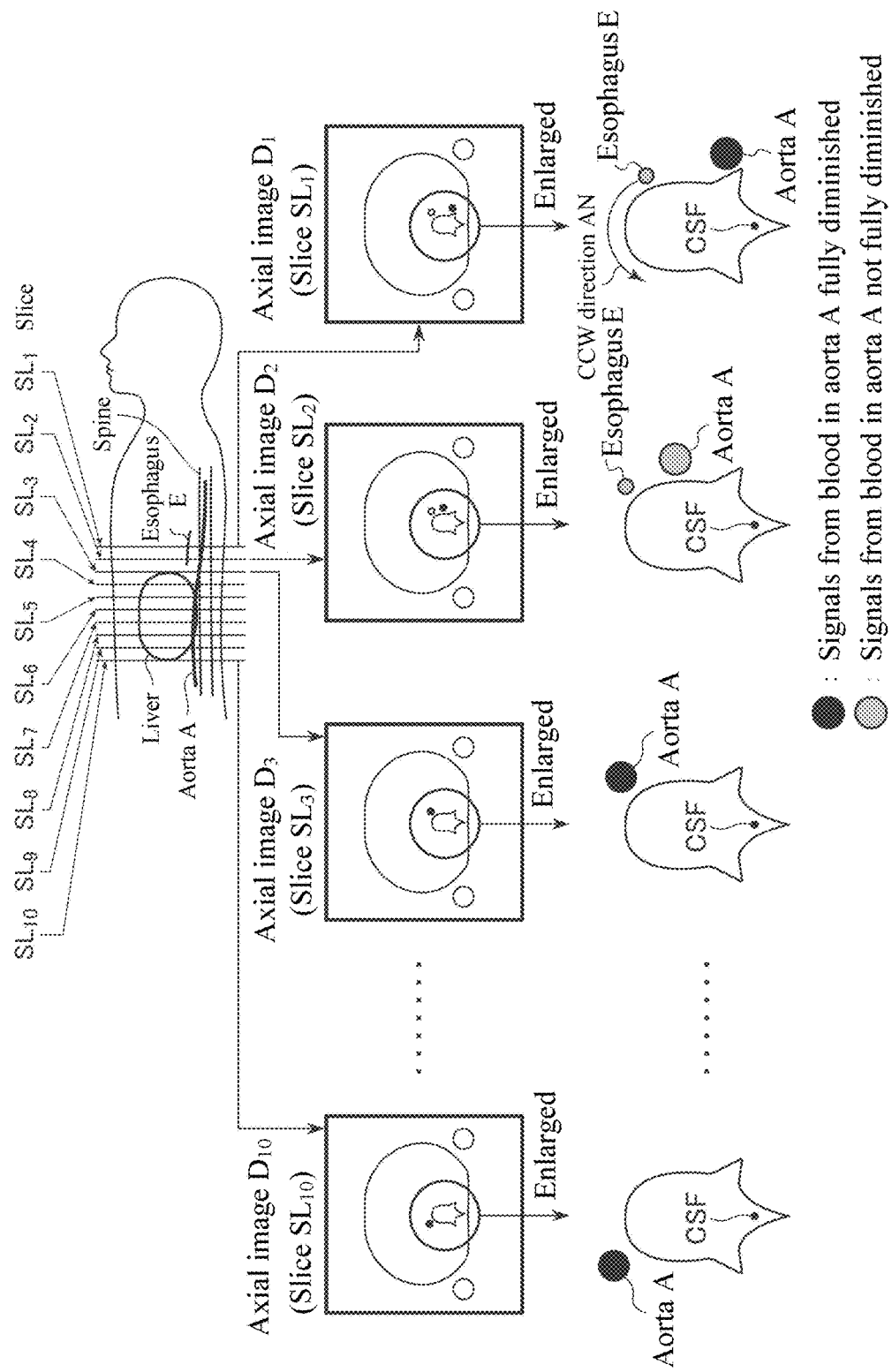
FIG. 6 is a diagram explaining a localizer scan LS.

FIG. 6 is a diagram explaining the localizer scan LS. The localizer scan LS is a scan for obtaining an image of a body part including the liver in the subject. FIG. 6 shows slices in performing the localizer scan LS. While the localizer scan LS obtains axial, sagittal, and coronal images, FIG. 6 shows m slices (where m=10 slices $SL_1$ to $SL_{10}$) for obtaining axial images, for convenience of explanation.

In performing the localizer scan LS, the control section 6 (see FIG. 1) sends data for an RF pulse in a sequence used in the localizer scan LS to the transmitter 7, and data for a gradient pulse in the sequence used in the localizer scan LS to the gradient magnetic power supply 8. The transmitter 7 supplies electric current to the RF coil 24 based on the data received from the control section 6, while the gradient power supply 8 supplies electric current to the gradient coil 23 based on the data received from the control section 6. Thus, the RF coil 24 applies an RF pulse, while the gradient coil 23 applies a gradient pulse. By performing the localizer scan LS, an MR signal is generated from the body part to be imaged. The MR signal is received by the receive coil 4 (see FIG. 1). The receive coil 4 receives the MR signal and outputs an analog signal containing information on the MR signal. The receiver 9 applies signal processing, such as demodulation/detection, to the signal received from the receive coil 4, and outputs data resulting from the signal processing to the processing apparatus 10.

The image producing unit 101 (see FIG. 2) produces images $D_1$ to $D_{10}$ for the slices $SL_1$ to $SL_{10}$ based on the data obtained by the localizer scan LS (which images will be referred to as "axial images" hereinbelow). Since the slices $SL_1$ to $SL_{10}$ intersect the aorta A, the axial images $D_1$ to $D_{10}$ render cross sections of the aorta A. It can be seen by comparing the position of the cross section of the aorta A among the axial images $D_1$ to $D_{10}$ that the cross section of the aorta A revolves around a spine in a counterclockwise direction AN as the slice approaches from the slice $SL_1$ to the slice $SL_{10}$.

Moreover, slices $SL_1$ and $SL_2$ among the slices $SL_1$ to $SL_{10}$ intersect an esophagus. Therefore, the axial images $D_1$ and $D_2$ also render cross sections of the esophagus.

The sequence used in the localizer scan LS is designed to inhibit as much as possible echo signals from blood with high flow velocity from being focused. Therefore, the signals from blood with high flow velocity may be fully diminished. Now consider the flow velocity of blood passing through the aorta A, for example: since the flow velocity of blood passing through the aorta A is high, signals from blood in the aorta A may be fully diminished. Therefore, signals from blood in the aorta A in each of the axial images $D_1$ to $D_{10}$ should be ideally fully diminished.

In cardiac systole, however, the flow velocity of blood in the aorta A is reduced, and accordingly, signals from blood in the aorta A cannot be fully diminished depending on timing of data acquisition. Therefore, in practice, axial images $D_1$ to $D_{10}$ may include some images in which signals from blood in the aorta A are not fully diminished.

In FIG. 6, when signals from blood in the aorta A are fully diminished, the aorta A is represented in black, while when signals from blood in the aorta A are not fully diminished, the aorta A is represented in gray. For example, since the aorta A is represented in black in the axial images $D_1$, $D_3$, $D_{10}$, blood signals therein are fully diminished. On the other hand, the aorta A is represented in gray in the axial image $D_2$, so that blood signals therein are not fully diminished.

Moreover, in the axial images $D_1$ and $D_2$ for the slices intersecting the esophagus, the esophagus is rendered with low signals, as well as the aorta A. After the axial images $D_1$ to $D_{10}$ are produced, the flow goes to Step ST2.

At Step ST2, processing for locating a position of the aorta A is performed on an axial image-by-axial image basis. In the present embodiment, a classifier for identifying the aorta A is used to locate a position of the aorta A. Now a method of creating a classifier will be described below.

A classifier is prepared beforehand prior to imaging of the subject. In the present embodiment, the classifier is created by machine learning. Specifically, training data is prepared, and is learned by machine learning to thereby create a classifier C suitable for detecting the aorta A (see FIG. 7).

Figure 7:
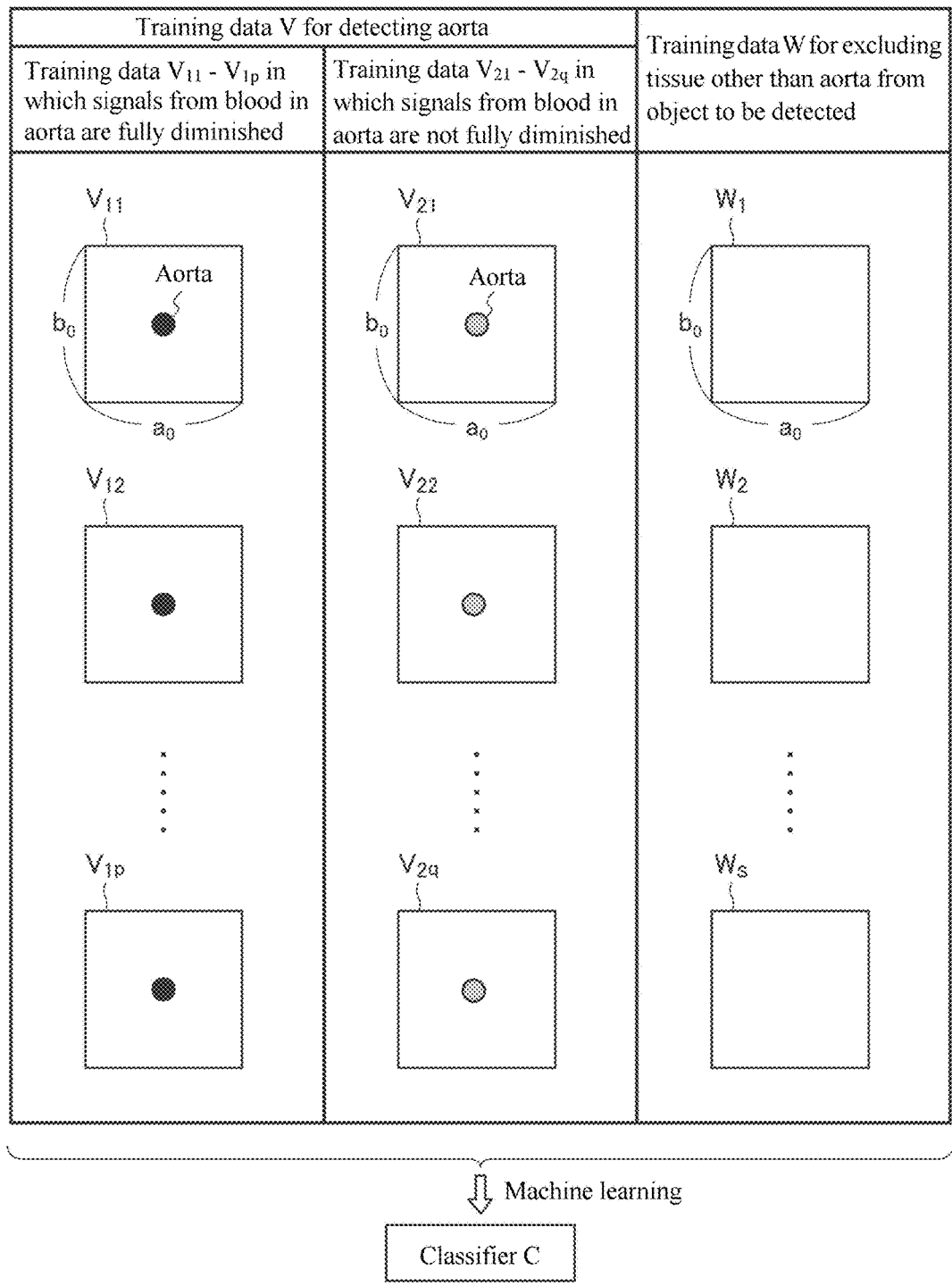
FIG. 7 is a diagram schematically showing training data used for creating a classifier C.

FIG. 7 is a diagram schematically showing training data used for creating the classifier C. The training data may be created using axial images for the abdomen, axial images for the chest, etc. obtained by imaging a plurality of actual human beings. In the present embodiment, two kinds of training data: training data V and W, are employed. The training data V is data for detecting the aorta A from within each of the axial images $D_1$ to $D_{10}$, while the training data W is data for excluding tissues other than the aorta A from an object of detection. The training data V and W are defined as data in a rectangular region of $a_0*b_0$ pixels. Now the training data will be sequentially described.

For training data V, the training data V is classified into two kinds of training data: training data $v_{11}$ to $v_{1p}$ and training data $v_{21}$ to $v_{2q}$.

For training data $v_{11}$ to $v_{1p}$, the training data $v_{11}$ to $v_{1p}$ are defined so that the cross section of the aorta lies in a generally central portion of the rectangular region. The training data $v_{11}$ to $v_{1p}$ are data in which signals from blood in the aorta are fully diminished. The aorta in the training data $v_{11}$ to $v_{1p}$ is represented in black.

For training data $v_{21}$ to $v_{2q}$, the training data $v_{21}$ to $v_{2q}$ are defined so that the cross section of the aorta lies in a generally central portion of the rectangular region. The training data $v_{21}$ to $v_{2q}$ are data in which signals from blood in the aorta are not fully diminished. The aorta in the training data $v_{21}$ to $v_{2q}$ is represented in gray.

For training data W, the training data W includes training data $w_1$ to $w_s$ representing signals from tissues other than the aorta. The tissues other than the aorta are the liver and the kidney, for example.

Such training data V and W are prepared, and are learned by machine learning, whereby a classifier C suitable for detecting the aorta from within an axial image is created.

At Step ST2, the thus-created classifier C is used to locate a position of the aorta A. Now Step ST2 will be described below. Step ST2 has Steps ST21 to ST25, which will be described one by one.

At Step ST21, the map generating unit 102 (see FIG. 2) uses the classifier C created as described above to generate a map on an axial image-by-axial image basis for locating a region in which a probability that the aorta lies is high in that axial image. Now a method of generating the map will be described with reference to FIGS. 8 to 12.

FIGS. 8 to 12 are diagrams explaining a method of generating a map. It should be noted that any axial image is subjected to the same method of generating a map in the present embodiment. Therefore, an axial image $D_1$ is picked up from among the axial images $D_1$ to $D_{10}$ to describe the method of generating a map.

Figure 8:
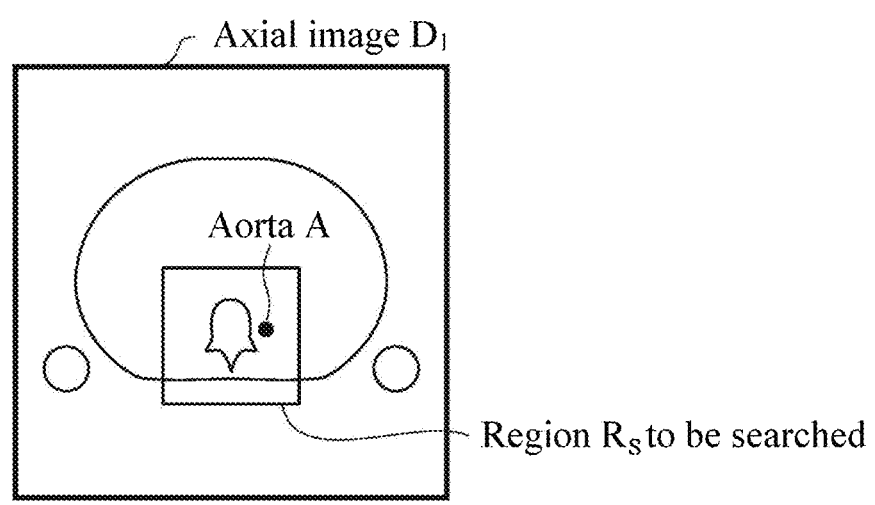
FIG. 8 is a diagram schematically showing a region $R_s$ to be searched.

At Step ST21, first, a region to be searched for searching for the aorta is defined. FIG. 8 schematically shows a region $R_s$ to be searched. The aorta is known to lie near the spinal cord. Therefore, the map generating unit 102 defines a region in the axial image $D_1$ including the spinal cord and its vicinity as the region $R_s$ to be searched for searching for the aorta.

Figure 9:
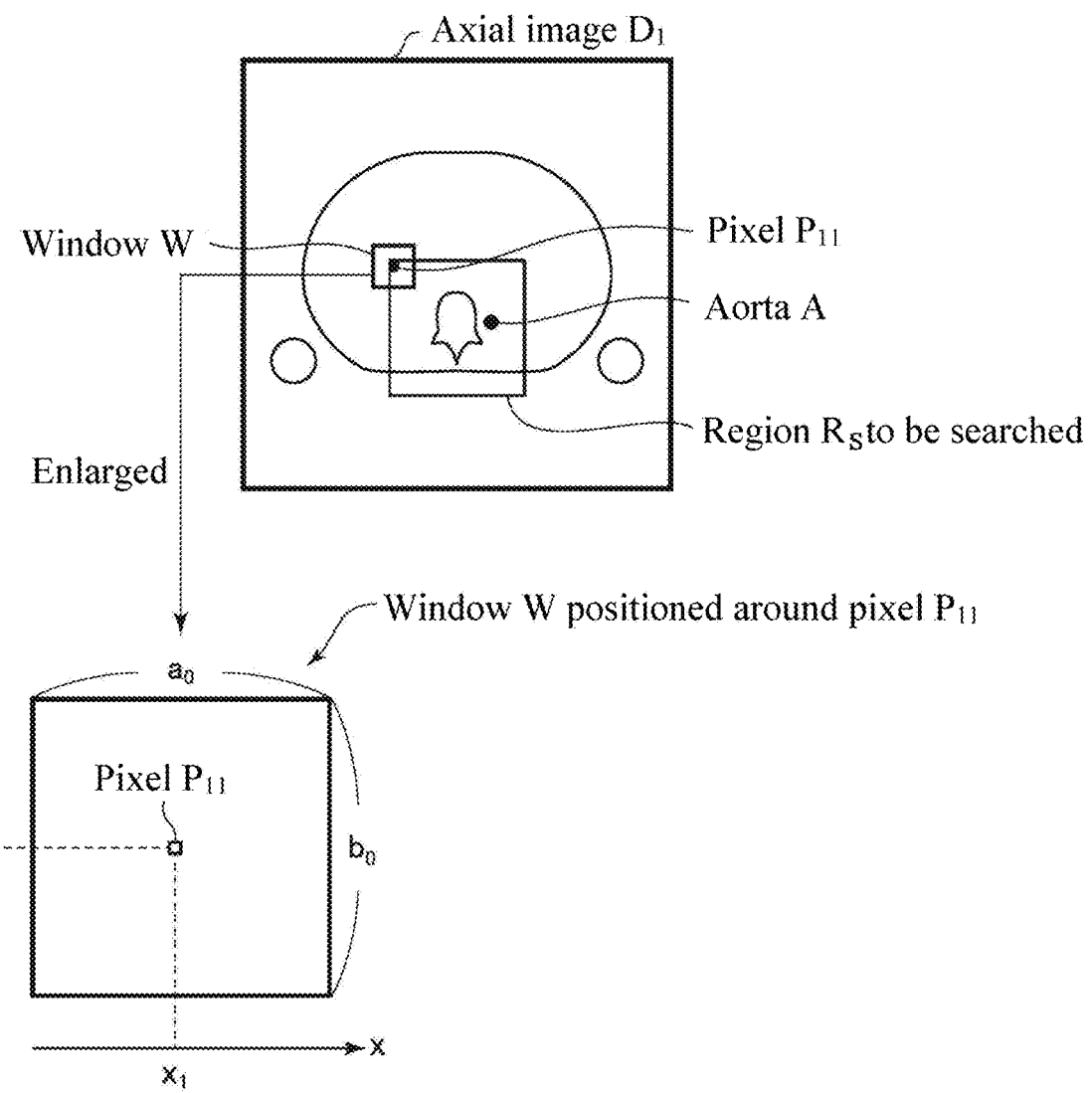
FIG. 9 is a diagram schematically showing a window W positioned around a pixel $P_{11}$.

After defining the region $R_s$ to be searched, the map generating unit 102 defines a window W around a pixel $P_{11}$ at coordinates (x1, y1) in the region $R_s$ to be searched. FIG. 9 schematically shows the window W positioned around the pixel $P_{11}$. The window W has a size of $a_0*b_0$.

Figure 10:
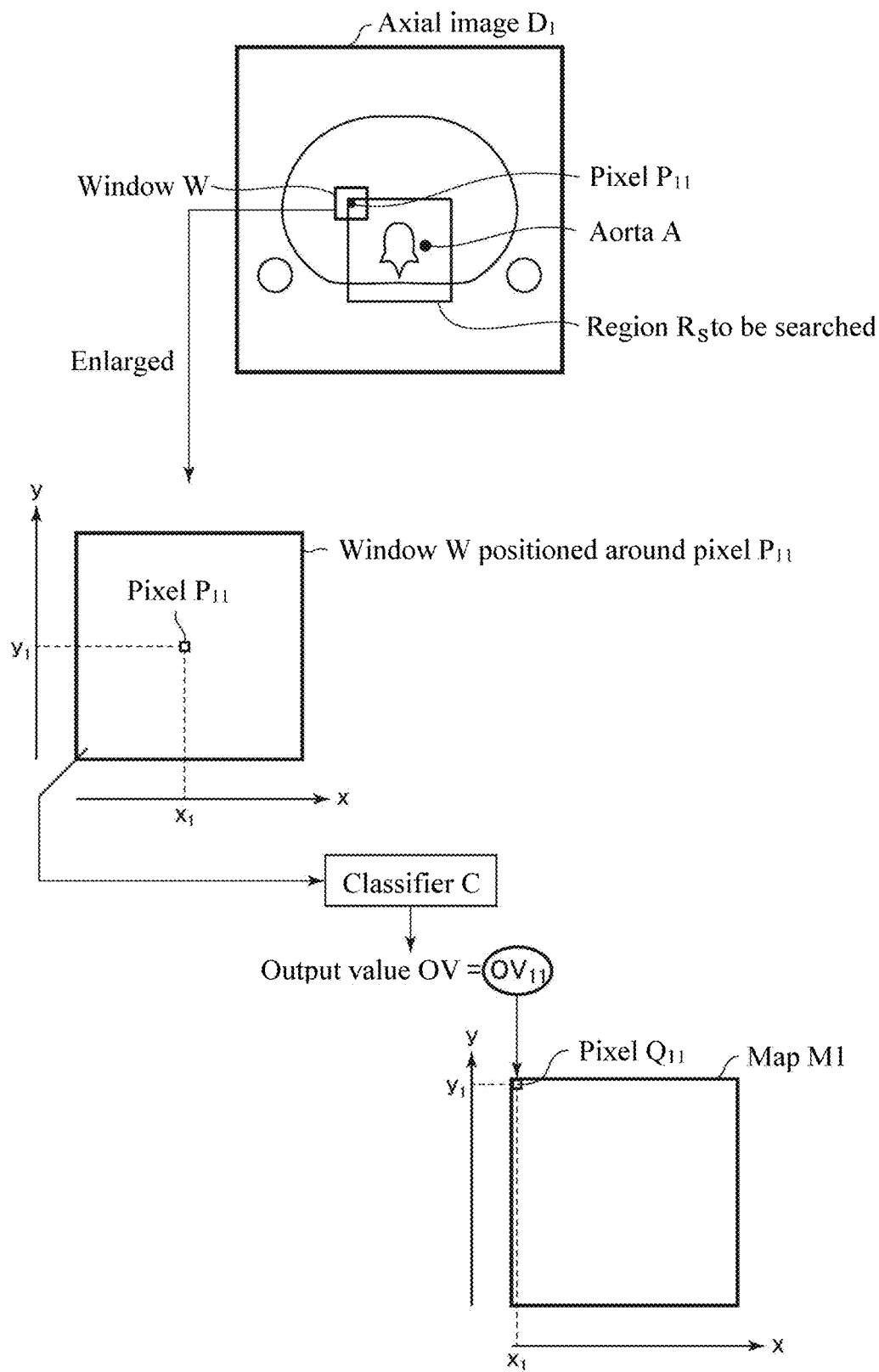
FIG. 10 is a diagram explaining a process of determining a pixel value in a map M1.

After defining the window W, the map generating unit 102 uses the classifier C to determine a pixel value of a pixel $Q_{11}$ at coordinates (x1, y1) in the map M1 (see FIG. 10).

FIG. 10 is a diagram explaining a process of determining a pixel value in the map M1. The map generating unit 102 extracts data representing a pixel value of each pixel contained in the window W. The classifier C outputs a value for deciding whether a probability that the aorta A in the axial image $D_1$ is contained in the window W is high or low based on the extracted data. In the present embodiment, the classifier C is constructed so that an output value OV increases as the probability that the aorta A lies in the central portion of the window W is higher. This means that for a smaller output value OV of the classifier C, the probability that the aorta is contained in the window W is lower, whereas for a greater output value OV of the classifier C, the probability that the aorta is contained in the window W is higher.

In FIG. 10, the output value OV of the classifier C obtained when the window W is positioned around the pixel $P_{11}$ is represented by $OV=OV_{11}$. Therefore, the pixel value of the pixel $Q_{11}$ in the map M1 at the coordinates $(x_1, y_1)$ is $OV_{11}$. Since the pixel $P_{11}$ in the axial image $D_1$ is not a pixel of the aorta, the output value $OV=OV_{11}$ of the classifier C is a sufficiently small value.

Figure 11:
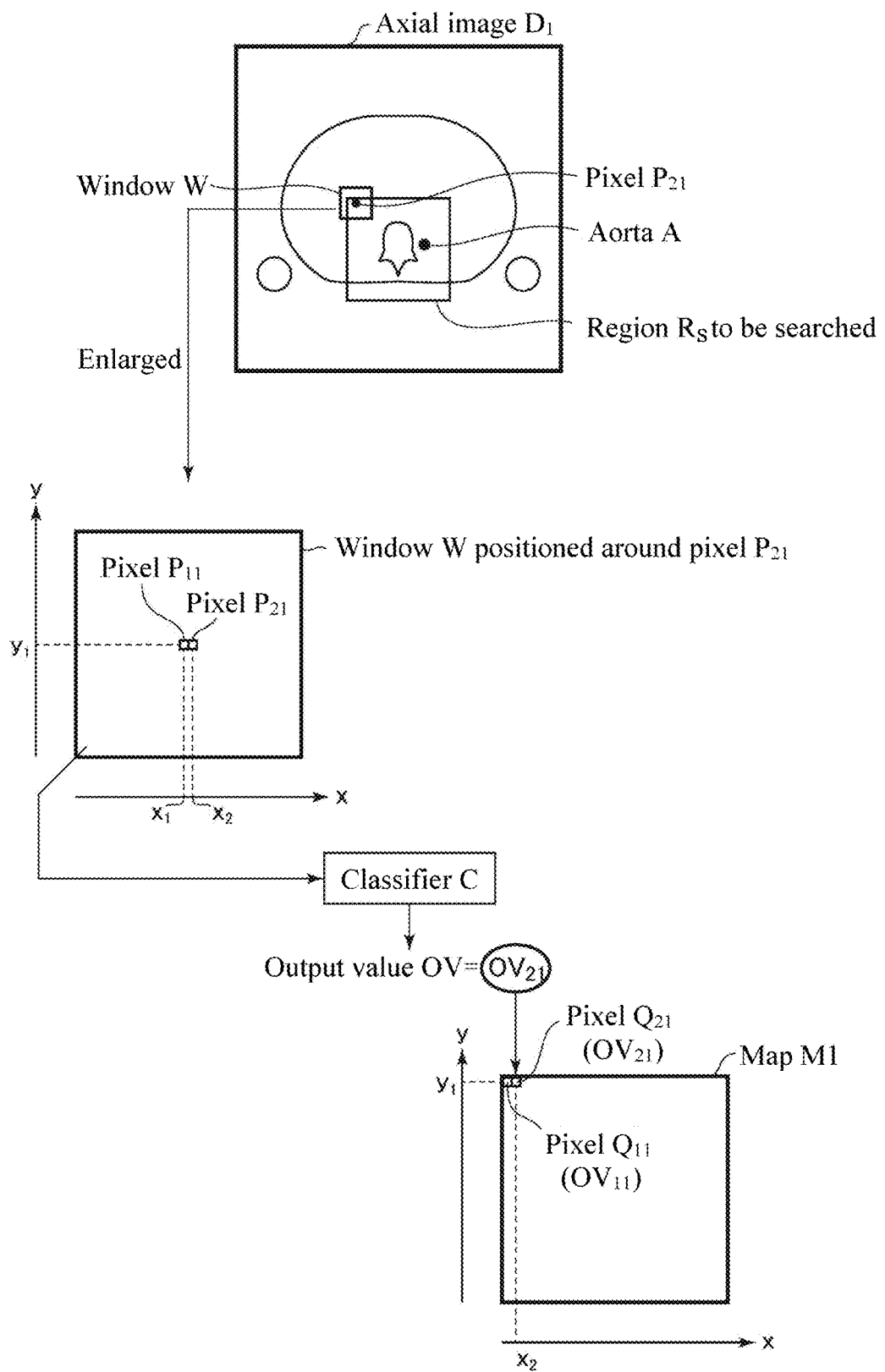
FIG. 11 is a diagram showing a condition in which the window W is positioned around a pixel $P_{21}$.

After the output value $OV=OV_{11}$ of the classifier C is obtained, the map generating unit 102 shifts the position of the window W from the pixel $P_{11}$ to a next pixel $P_{21}$. FIG. 11 shows a condition in which the window W is positioned around the pixel $P_{21}$. The pixel $P_{21}$ is a pixel at coordinates $(x_2, y_1)$. After shifting the window W to the pixel $P_{21}$, data for pixels contained in the window W positioned around the pixel $P_{21}$ are extracted. The classifier C outputs a value for deciding the probability that the aorta A in the axial image $D_1$ is contained in the window W is high or low based on the extracted data. In FIG. 11, the output value OV of the classifier C obtained when the window W is positioned around the pixel $P_{21}$ is represented by $OV=OV_{21}$. Therefore, the pixel value of a pixel $Q_{21}$ in the map M1 at coordinates $(x_2, y_1)$ is $OV_{21}$. The pixel $P_{21}$ in the axial image $D_1$ is not a pixel of the aorta as with the pixel $P_{11}$, so that the output value $OV=OV_{21}$ of the classifier C is a sufficiently small value.

Figure 12:
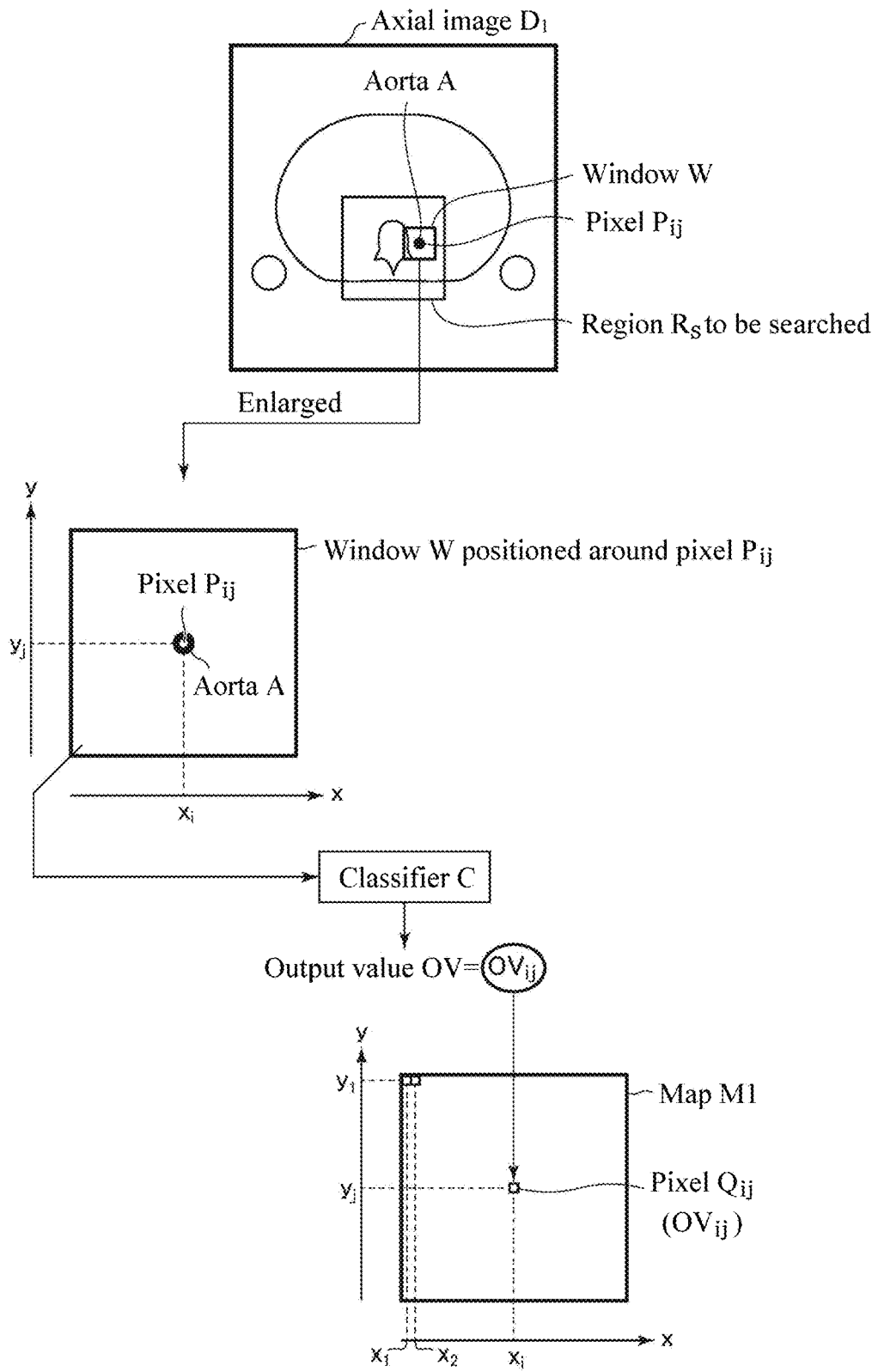
FIG. 12 is a diagram showing a condition in which the window W is positioned around a pixel $P_{ij}$ at coordinates ($x_i$, $y_i$) within a cross section of an aorta.

Similarly thereafter, the window W is shifted one-pixel by one-pixel, and each time the window W is shifted, the classifier C outputs a value for deciding whether the probability that the aorta A in the axial image $D_1$ is contained in the window W is high or low based on the data extracted from within the window W. FIG. 12 shows a condition in which the window W is positioned around a pixel $P_{ij}$ at coordinates $(x_i, y_i)$ within the cross section of the aorta. After shifting the window W to the pixel $P_{ij}$, data for pixels contained in the window W positioned around the pixel $P_{ij}$ are extracted. The classifier C outputs a value for deciding whether the probability that the aorta A in the axial image $D_1$ is contained in the window W is high or low based on the extracted data. In FIG. 12, the output value OV of the classifier C obtained when the window W is positioned around the pixel $P_{ij}$ is represented as $OV=OV_{ij}$. Therefore, the pixel value of a pixel $Q_{ij}$ in the map M1 at coordinates $(x_i, y_j)$ is $OV_{ij}$. The pixel $P_{ij}$ in the axial image $D_1$ is a pixel within the cross section of the aorta, so that the output value $OV=OV_{ij}$ of the classifier C is a sufficiently large value.

Figure 13:
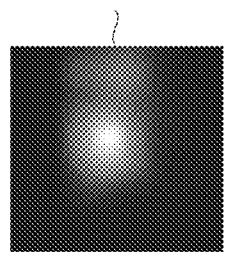
FIG. 13 is a diagram showing the map M1.
Figure 13:
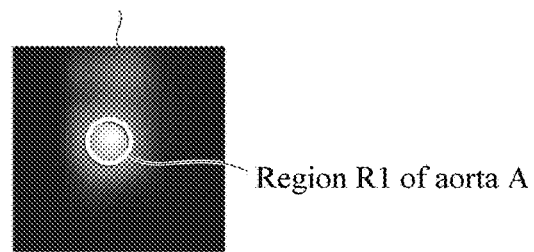

Similarly thereafter, each time the position of the window W is shifted, an output value OV is output. Since the output value OV of the classifier C can thus be obtained for each pixel in the region $R_s$ to be searched, the map M1 (an example of the first map) may be generated. FIG. 13 shows an example of an actually obtained map M1 on the left. In FIG. 13, a difference in pixel value among pixels in the map M1 is represented by shading of color. A lighter shade of color represents a greater output value of the classifier C (i.e., a higher probability that the aorta A is contained), while a darker shade of color represents a smaller output value of the classifier C (i.e., a lower probability that the aorta A is contained). It can thus be seen that a region having a high probability that the aorta A lies in it may be located by the map M1. FIG. 13 shows a region R1 of the aorta in the map M1 on the right. It can be seen from the fact that the inside of the region R1 of the aorta A is white that the pixel value is large. After obtaining the map M1, the flow goes to Step ST22.

At Step ST22, the detecting unit 103 (see FIG. 2) detects a temporary position of the aorta based on the map M1.

Figure 14:
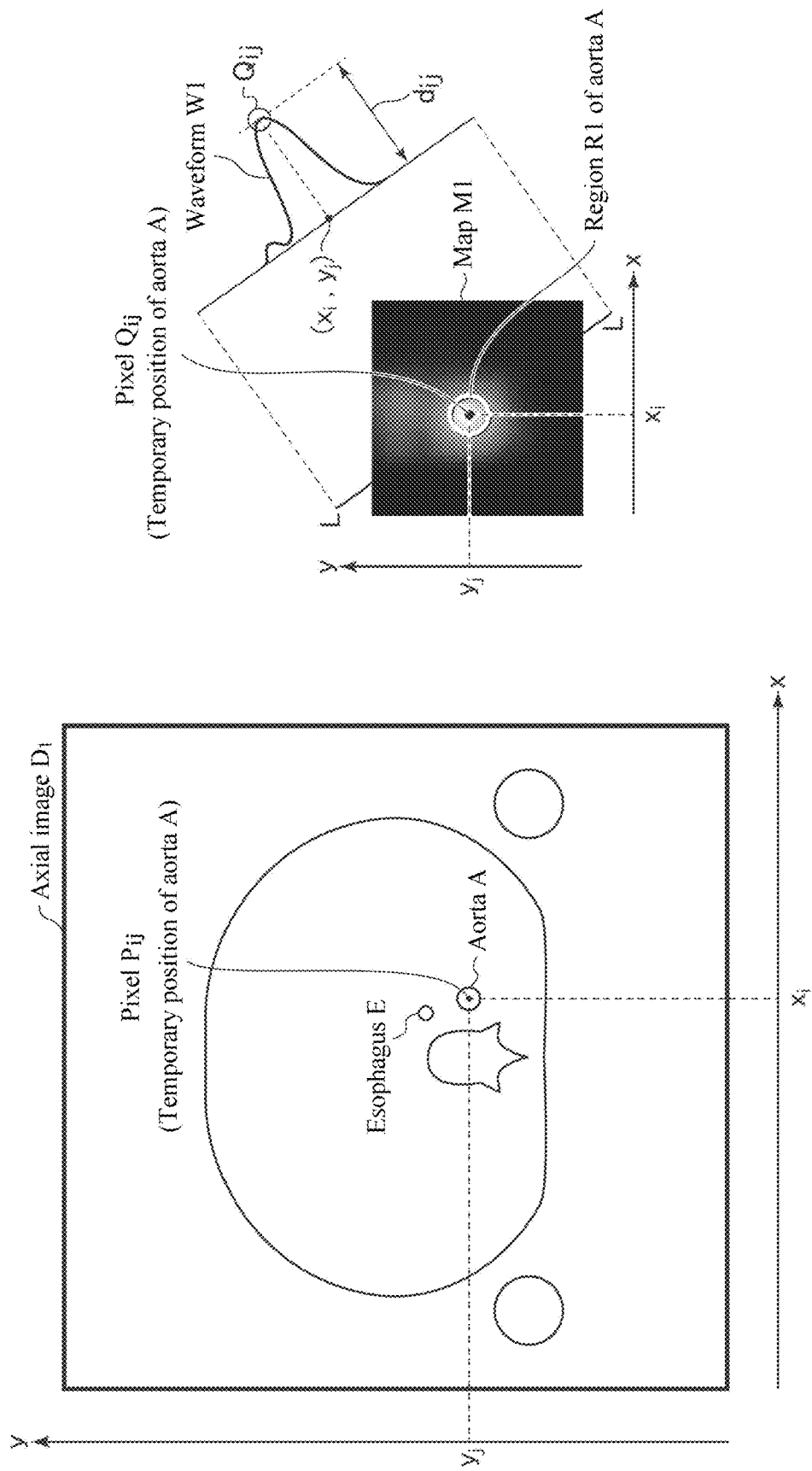
FIG. 14 is a diagram explaining a process of detecting a temporary position of the aorta based on the map M1.

FIG. 14 is a diagram explaining a process of detecting a temporary position of the aorta based on the map M1. In FIG. 14, a waveform W1 representing the pixel value along line L-L intersecting the region R1 of the aorta A is schematically shown in the upper right of the map M1 for convenience of explanation.

In detecting a temporary position of the aorta A, the detecting unit 103 locates a position of a pixel having a largest pixel value from within the map M1. In FIG. 14, it is assumed that pixel $Q_{ij}$ at coordinates $(x_i, y_j)$ has a largest pixel value $d=d_{ij}$. Therefore, the coordinates $(x_i, y_j)$ of the pixel $Q_{ij}$ are identified as a position of a pixel having a largest pixel value. As described earlier, the pixel value in the map M1 is larger for a higher probability that the aorta lies there. Accordingly, in the present embodiment, the coordinates $(x_i, y_j)$ of the pixel $Q_{ij}$ having a largest pixel value $d_{ij}$ among pixels contained in the map M1 are identified as a temporary position of the aorta A. Therefore, the detecting unit 103 detects a position of the pixel $P_{ij}$ at the coordinates $(x_i, y_j)$ in the axial image $D_1$ as a temporary position of the aorta A.

Referring to the axial image $D_1$, the pixel $P_{ij}$ representing the temporary position of the aorta A falls within the region of the aorta. This proves that the position of the aorta A is correctly detected by using the map M1 in FIG. 14.

Next, the axial image $D_2$ is picked up to describe Steps ST21 and ST22.

For the axial image $D_2$, signals from blood in the aorta are not fully diminished (see FIG. 6). In the present embodiment, however, the classifier C is created using not only the training data $v_{11}$ to $v_{1p}$ (see FIG. 7) in which signals from blood in the aorta are fully diminished, but also using the training data $v_{21}$ to $v_{2q}$ (see FIG. 7) in which signals from blood in the aorta are not fully diminished. Therefore, even when signals from blood in the aorta A are not fully diminished, as in the axial image $D_2$, it is still possible to detect the position of the aorta A by performing Steps ST21 and ST22. When signals from blood in the aorta A are not fully diminished, however, the signal intensity in the cross section of the esophagus E may sometimes have a value close to that of the signal intensity in the cross section of the aorta A. In this case, it is difficult to distinguish between the cross section of the esophagus E and that of the aorta A by using the classifier C. Therefore, when a map is created based on the axial image $D_2$ at Step ST21, a map as described below may be obtained (see FIG. 15).

Figure 15:
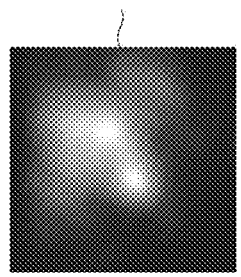
FIG. 15 is a diagram showing an example of a map M2 created based on an axial image $D_2$.
Figure 15:
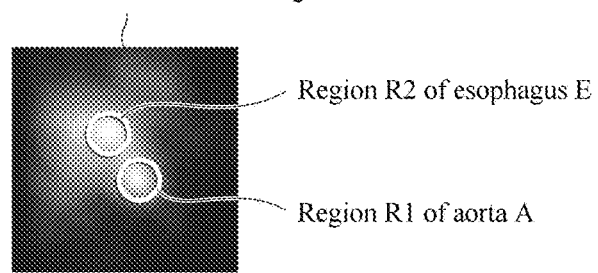

FIG. 15 is a diagram showing an example of a map M2 created based on the axial image D2. FIG. 15 shows a map M2 (another example of the first map) on the left. FIG. 15 also shows a region R1 of the aorta and a region R2 of the esophagus in the map M2 on the right. Referring to the map M2, it can be seen that the region R2 of the esophagus has large pixel values, as well as the region R1 of the aorta. After generating the map M2, a temporary position of the aorta is detected based on the map M2 at Step ST22 (see FIG. 16).

Figure 16:
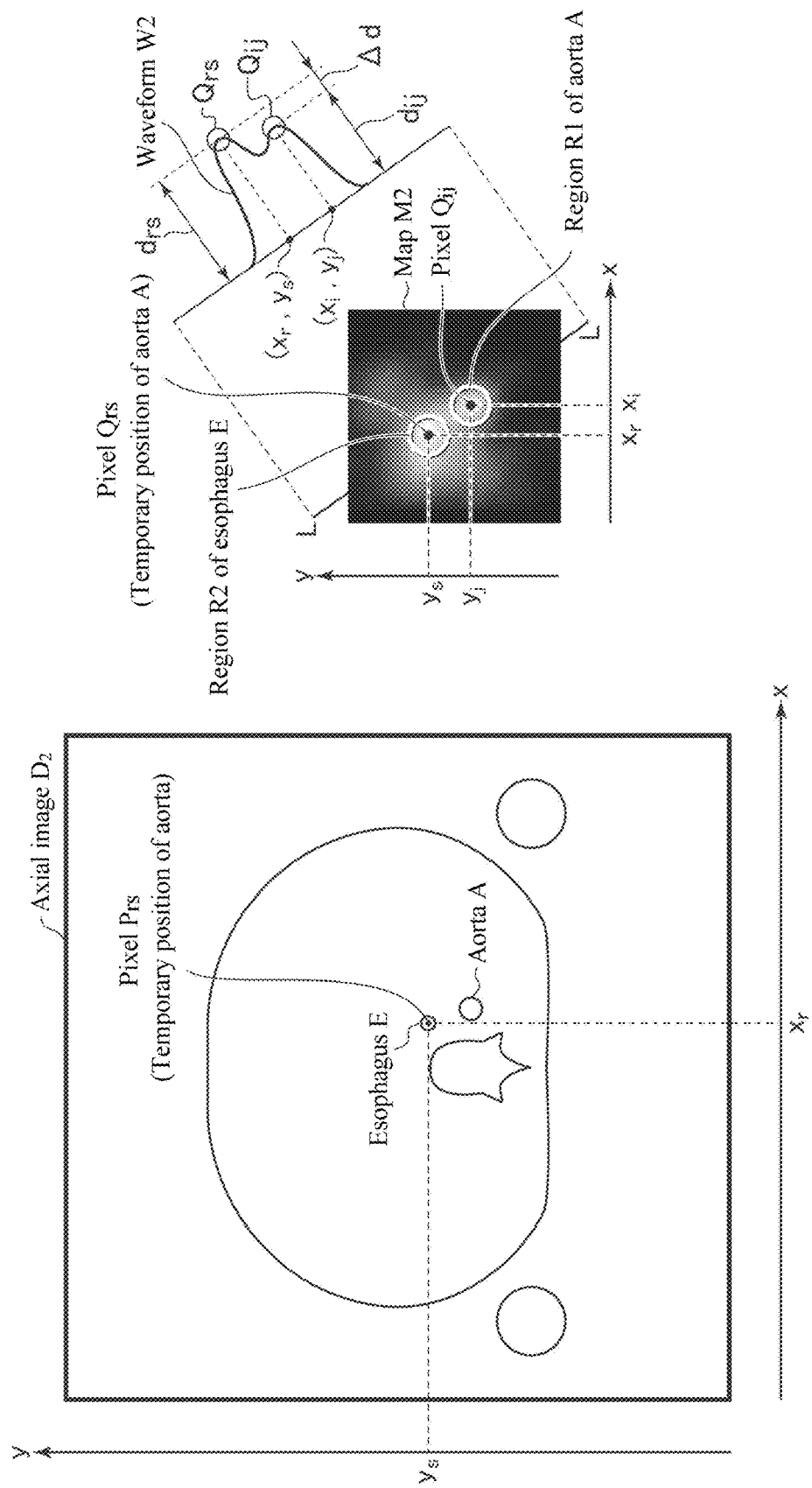
FIG. 16 is a diagram explaining a process of detecting a temporary position of the aorta based on the map M2.

FIG. 16 is a diagram explaining a process of detecting a temporary position of the aorta based on the map M2. In FIG. 16, a waveform W2 representing the pixel value along line L-L intersecting the region R1 of the aorta and region R2 of the esophagus is schematically shown in the upper right of the map M2 for convenience of explanation.

In the map M2, a pixel value $d_{rs}$ of a pixel $Q_{rs}$ in the region R2 of the esophagus at coordinates $(x_r, y_s)$ is larger by $\Delta d$ than the pixel value of the pixel $Q_{ij}$ in the region R1 of the aorta at the coordinates $(x_i, y_j)$. Therefore, the detecting unit 103 detects the position of the pixel $P_{rs}$ in the axial image $D_2$ at the coordinates $(x_r, y_s)$ as a temporary position of the aorta A. The pixel $P_{rs}$, however, is a pixel lying in the inside of the region of the esophagus E, which proves that the position of the aorta A is not correctly detected. Accordingly, in the present embodiment, after determining the temporary position of the aorta at Step ST22, a decision is made on whether or not the temporary position of the aorta falls within the region of the aorta A at Step ST23. Now a decision method at Step ST23 will be described below.

Step ST23 uses a distribution model representing a range over which the aorta distributes relative to the position of the esophagus to decide whether or not the temporary position of the aorta is an actual position of the aorta A. The distribution model is prepared beforehand prior to imaging of the subject. Now an example of a method of creating the distribution model will be described hereinbelow, and Step ST23 will be specifically described thereafter.

Figure 17:
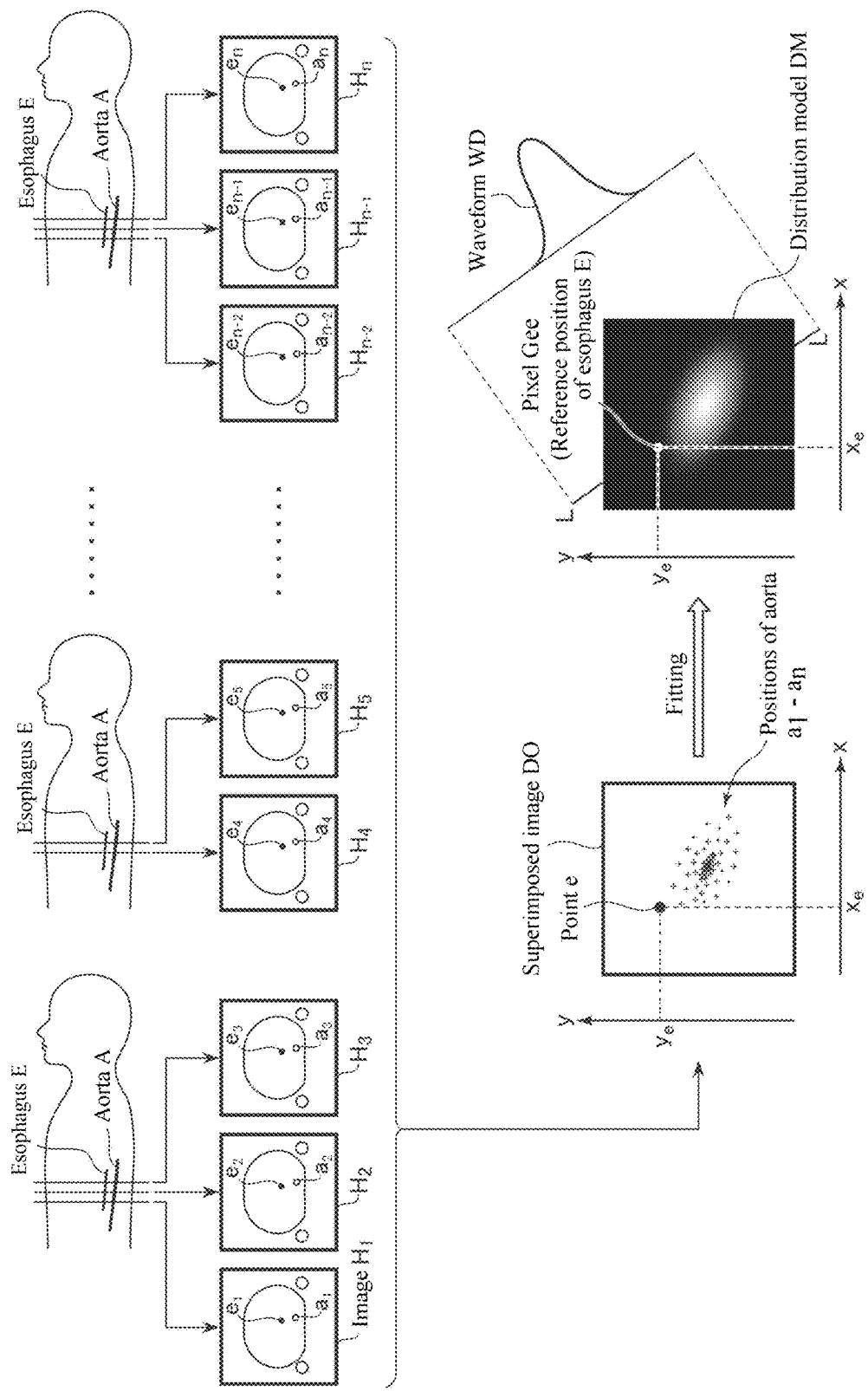
FIG. 17 is a diagram explaining an exemplary method of generating a distribution model.

FIG. 17 shows a diagram explaining an exemplary method of creating a distribution model. In FIG. 17, a plurality of images $H_1$ to $H_n$ for creating a distribution model are schematically shown. These images $H_1$ to $H_n$ represent axial images obtained by scanning axial planes passing through a body part including the esophagus and aorta for a plurality of actual human bodies.

First, a creator (for example, an image processing specialist) of a distribution model specifies a position of the esophagus and a position of the aorta for each of the images $H_1$ to $H_n$. In FIG. 17, the position of the esophagus specified for each image is designated by symbols $e_1$ to $e_n$, and that of the aorta specified for each image is designated by symbols $a_1$ to $a_n$.

The positions $e_1$ to $e_n$ of the esophagus may be the position of a centroid of the cross section of the esophagus, for example, while the positions $a_1$ to $a_n$ of the aorta may be the position of a centroid of the cross section of the aorta, for example.

After the positions $e_1$ to $e_n$ of the esophagus and positions $a_1$ to $a_n$ of the aorta are specified, images $H_1$ to $H_n$ are superimposed over one another so that the positions $e_1$ to $e_n$ of the esophagus in the images $H_1$ to $H_n$ are overlaid on one another. FIG. 17 schematically shows in the lower left a superimposed image DO obtained by superimposing the images $H_1$ to $H_n$ over one another. Coordinates $(x_e, y_e)$ of a point e in the superimposed image DO represent a position at which the positions $e_1$ to $e_n$ of the esophagus in the images $H_1$ to $H_n$ are overlaid on one another, which represents a reference position of the esophagus. In addition to the positions $e_1$ to $e_n$ of the esophagus, the positions $a_1$ to $a_n$ of the aorta are specified in the images $H_1$ to $H_n$, and thus, the positions $a_1$ to $a_n$ (indicated by a symbol "+") of the aorta in the images $H_1$ to $H_n$ are defined relative to the reference position $(x_e, y_e)$ of the esophagus in the superimposed image DO. Thus, data representing the positions $a_1$ to $a_n$ of the aorta relative to the reference position $(x_e, y_e)$ of the esophagus may be obtained. A prespecified function is then used to fit to the data representing the positions $a_1$ to $a_n$ in the superimposed image DO, and a coefficient value(s) in the prespecified function is identified. The prespecified function that may be used is a function representing a two-dimensional Gaussian distribution, for example. By applying the fitting, a distribution model DM may be obtained. FIG. 17 shows an example of the resulting distribution model DM in the lower right. The distribution model DM contains information representing the reference position $(x_e, y_e)$ of the esophagus and information representing a range over which the aorta distributes relative to the reference position $(x_e, y_e)$ of the esophagus. Coordinates $(x_e, y_e)$ of a pixel $G_{ee}$ in the distribution model DM is the reference position of the esophagus. In the upper right of the distribution model DM is schematically shown a waveform WD representing the pixel value along line L-L intersecting the reference position $(x_e, y_e)$ of the esophagus and a region (the portion rendered in white) over which the positions $a_1$ to $a_n$ of the aorta distribute in the distribution model DM.

In FIG. 17, the distribution model DM is rendered using grayscale. A color closer to white indicates a higher probability that the aorta lies there, while a color closer to black indicates a lower probability that the aorta lies there. Therefore, it can be seen from FIG. 17 that the probability that the aorta lies in the lower right region relative to the reference position $(x_e, y_e)$ of the esophagus is high.

At Step ST23, the map obtained at Step ST21 is multiplied by the distribution model DM described above to generate a multiplied map, which will be discussed later. Based on the multiplied map, a decision is then made on whether or not the temporary position of the aorta falls within the region of the aorta. By using the distribution model DM to generate a multiplied map, it is possible to decide whether or not the temporary position of the aorta falls within the region of the aorta A regardless of which of the map M1 or M2 is obtained. Now Step ST23 will be specifically described below. In the following description, to clarify a reason why whether or not the temporary position of the aorta falls within the region of the aorta A may be decided based on the multiplied map, the principle of the decision method Step ST23 will be briefly explained before specifically describing Steps ST23a and ST23b included in Step ST23. After explaining the principle of the decision method, Step ST23a and ST23b in Step ST23 will be specifically described.

Figure 18:
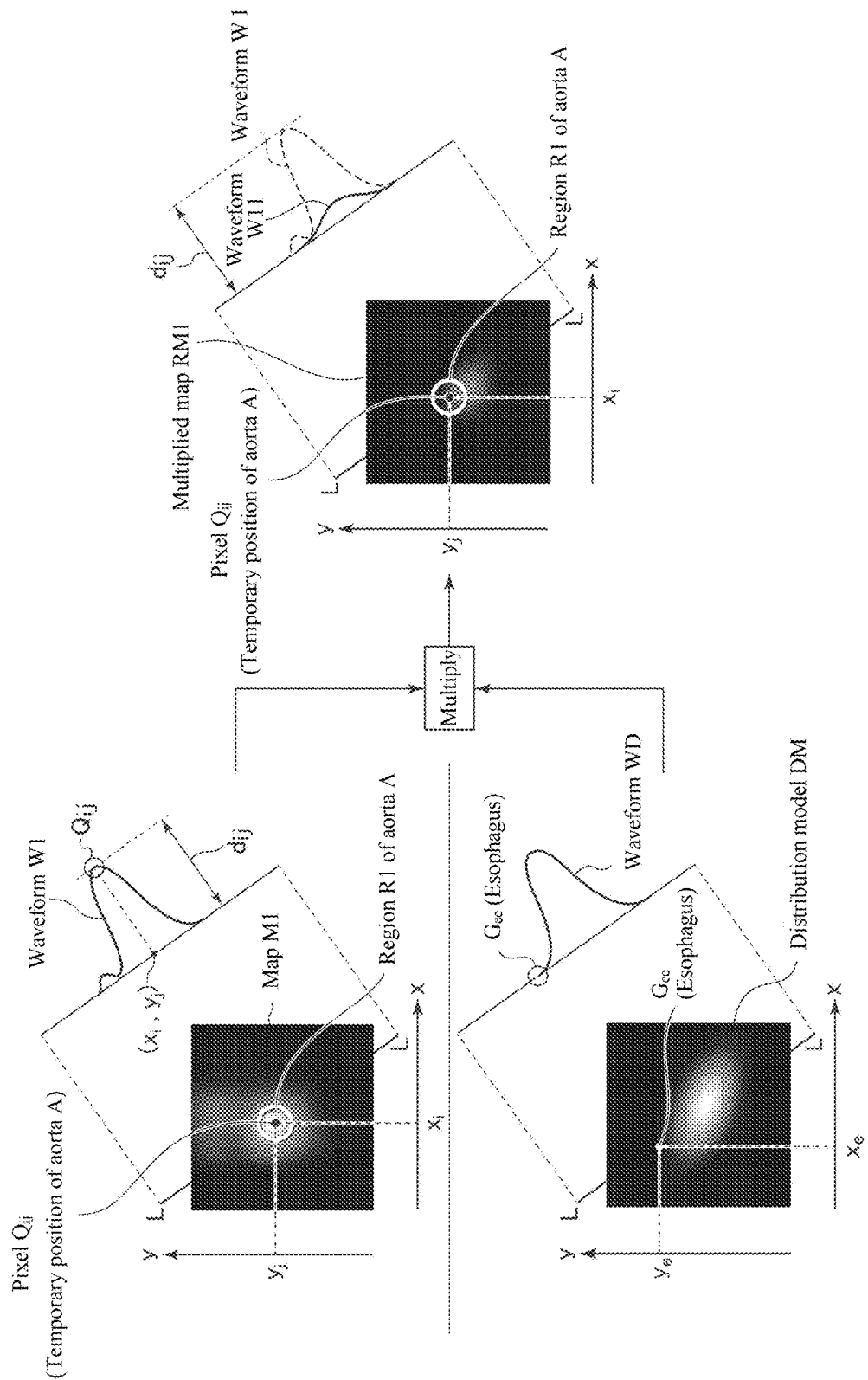
FIG. 18 is a diagram explaining a method of generating a multiplied map based on the map M1 and distribution model DM.
Figure 19:
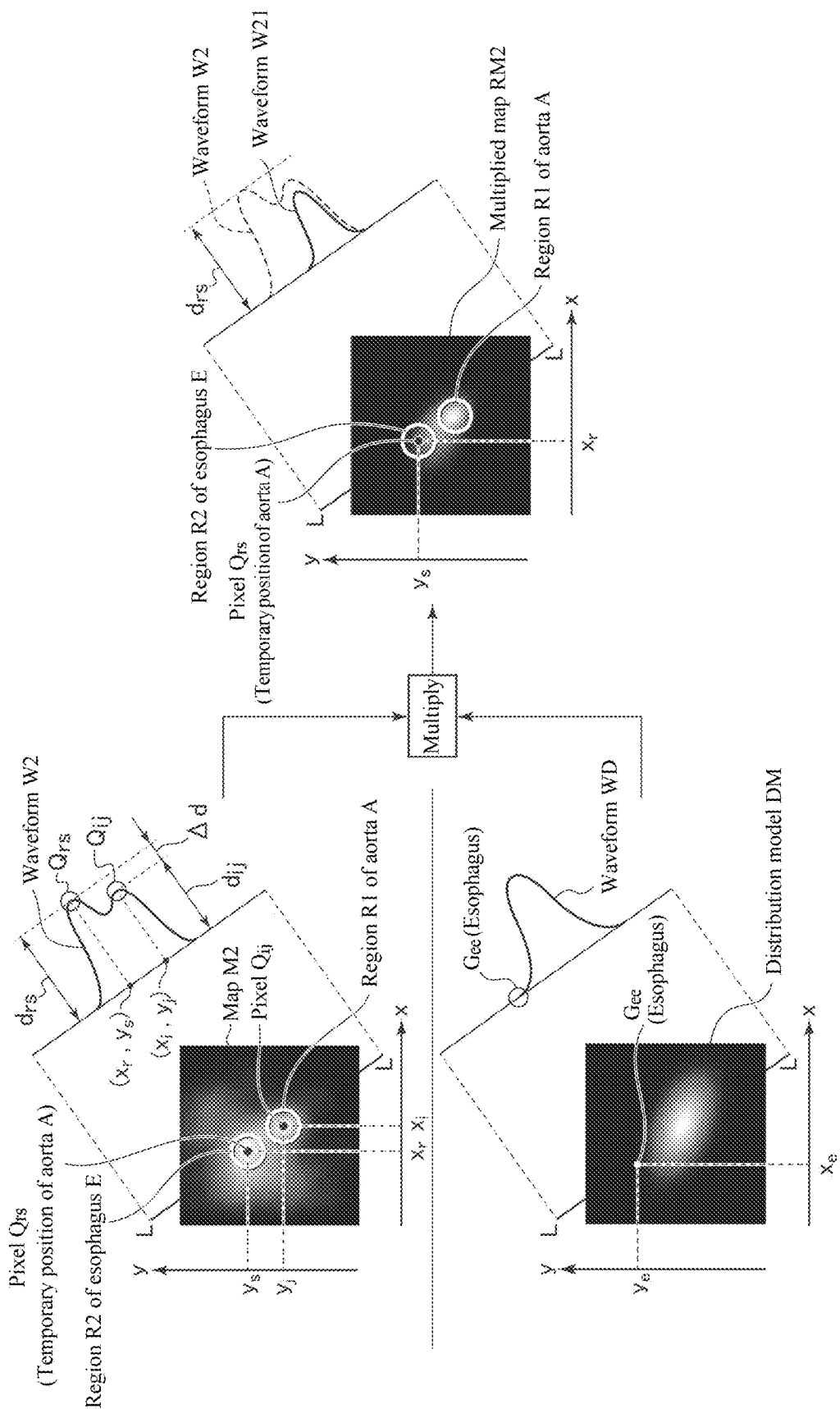
FIG. 19 is a diagram explaining the method of generating a multiplied map based on the map M2 and distribution model DM.

FIGS. 18 and 19 are diagrams explaining the principle of the decision method at Step ST23. First, FIG. 18 will be described below.

FIG. 18 is a diagram explaining a method of generating a multiplied map RM1 based on the map M1 obtained from the axial image $D_1$ and on the distribution model DM. FIG. 18 shows the map M1 and distribution model DM on the left, and on the right a map RM1 obtained by multiplying the map M1 by the distribution model DM (which map RM1 will be referred to as "multiplied map" hereinbelow). In the present embodiment, the map M1 is multiplied by the distribution model DM so that the coordinates $(x_i, y_i)$ of the pixel $Q_{ij}$ (temporary position of the aorta) in the map M1 match the coordinates $(x_e, y_e)$ of the pixel $G_{ee}$ of the esophagus (reference position of the esophagus) in the distribution model DM, thus obtaining the multiplied map RM1 (an example of the second map).

The multiplied map RM1 is rendered in grayscale. A color closer to white indicates a larger pixel value, while a color closer to black indicates a smaller pixel value. In the upper right of the multiplied map RM1 is schematically shown a waveform W11 (solid line) representing the pixel value along line L-L intersecting the region R1 of the aorta in the multiplied map RM1. It should be noted that in FIG. 18, the waveform W1 along line L-L in the map M1 is shown in a dashed line over line L-L in the multiplied map RM1 for comparison.

At Step ST23, as described above, the map M1 is multiplied by the distribution model DM so that the coordinates $(x_i, y_i)$ of the pixel $Q_{ij}$ (temporary position of the aorta) in the map M1 match the coordinates $(x_e, y_e)$ of the pixel $G_{ee}$ of the esophagus (reference position of the esophagus) in the distribution model DM. In the distribution model DM, pixels in a region above the pixel $G_{ee}$ (the esophagus) have pixel values close to zero. Therefore, by multiplying the map M1 by the distribution model DM, the pixel $Q_{ij}$ and pixels in its nearby region in the map M1 come to have small pixel values. The multiplied map RM1 thus has significantly small pixel values as compared with the map M1.

In contrast, when the map M2 obtained from the axial image $D_2$ is multiplied by the distribution model DM, a multiplied map as described below is obtained (see FIG. 19).

FIG. 19 is a diagram explaining the method of generating a multiplied map based on the map M2 obtained from the axial image $D_2$ and distribution model DM. FIG. 19 shows the map M2 and distribution model DM on the left, and on the right a multiplied map RM2 obtained by multiplying the map M2 by the distribution model DM. In the present embodiment, the map M2 is multiplied by the distribution model DM so that the coordinates $(x_r, y_s)$ of the pixel $Q_{rs}$ (temporary position of the aorta) in the map M2 match the coordinates $(x_e, y_e)$ of the pixel $G_{ee}$ of the esophagus (reference position of the esophagus) in the distribution model DM, thus obtaining the multiplied map RM2 (another example of the second map). In the upper right of the multiplied map RM2 is schematically shown a waveform W21 (solid line) representing the pixel value along line L-L intersecting the region R1 of the aorta and region R2 of the esophagus in the multiplied map RM2. It should be noted that in FIG. 19, the waveform W2 along line L-L in the map M2 is shown in a dashed line over line L-L in the multiplied map RM2 for comparison.

At Step ST23, as described above, the map M2 is multiplied by the distribution model DM so that the coordinates $(x_r, y_s)$ of the pixel $Q_{rs}$ (temporary position of the aorta) in the map M2 match the coordinates $(x_e, y_e)$ of the pixel $G_{ee}$ of the esophagus (reference position of the esophagus) in the distribution model DM. In the distribution model DM, pixels in a region above the pixel $G_{ee}$ (the esophagus) have pixel values close to zero. Therefore, by multiplying the map M2 by the distribution model DM, pixels in the region R2 of the esophagus in the map M2 come to have small pixel values. Moreover, the distribution model DM has large pixel values in a region lower right to the reference position $(x_e, y_e)$ of the esophagus. Therefore, by multiplying the map M2 by the distribution model DM, pixels in the region R1 of the aorta in the map M2 still keep their large values. Thus, as compared with the map M2, the multiplied map RM2 has significantly small values for pixel values in the region R2 of the esophagus E, while it has sufficiently large values for pixel values in the region R1 of the aorta A.

Therefore, when the temporary position of the aorta falls within the region R1 of the aorta (see FIG. 18), the multiplied map RM1 generally has small pixel values. When the temporary position of the aorta does not fall within the region R1 of the aorta (see FIG. 19), the region R1 of the aorta in the multiplied map RM2 keeps its large pixel values. Therefore, the decision on whether the pixel value in a multiplied map is small or large makes it possible to decide whether or not the temporary position of the aorta falls within the region of the aorta.

Now the flow of Step ST23 for making a decision based on the principle described above will be specifically described below. In the following description, for convenience of explanation, the decision method at Step ST23 wherein the temporary position of the aorta A detected at Step ST22 falls within the region of the aorta A (see FIG. 14) will be described first, and then, the flow of the decision method at Step ST23 wherein the temporary position of the aorta A detected at Step ST22 does not fall within the region of the aorta A (see FIG. 16) will be described.

For the decision method at Step ST23 wherein the temporary position of the aorta A detected at Step ST22 falls within the region of the aorta A (see FIG. 14) First, at Step ST23a, the deciding unit 104 (see FIG. 2) multiplies the map M1 by the distribution model DM, as described earlier referring to FIG. 18. By multiplying the map M1 by the distribution model DM, a multiplied map RM1 is obtained.

As described earlier, the multiplied map RM1 has small pixel values. After obtaining the multiplied map RM1, the flow goes to Step ST23b.

Figure 20:
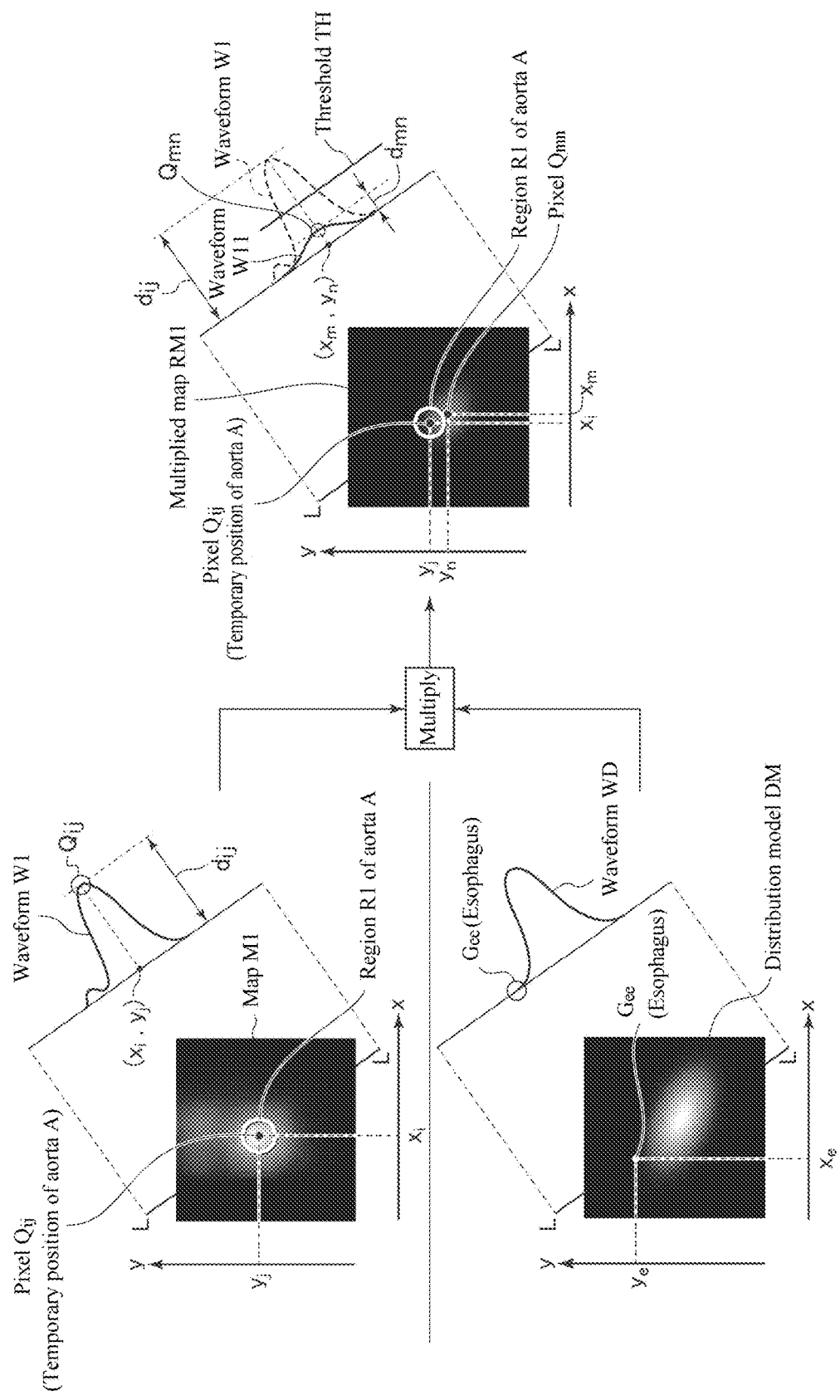
FIG. 20 is a diagram explaining Step ST23b.

FIG. 20 is a diagram explaining Step ST23b. At Step ST23b, a decision is made on whether or not the aorta is correctly detected based on the multiplied map. Now Step ST23b will be specifically described below.

At Step ST23b, first, the deciding unit 104 locates a position of a pixel having a largest pixel value from within the multiplied map RM1. It is assumed here that a pixel $Q_{mn}$ at coordinates $(x_m, y_n)$ has a largest pixel value $d=d_{mn}$. Therefore, the deciding unit 104 identifies the coordinates $(x_m, y_n)$ of the pixel $Q_{mn}$ as the position of a pixel having a largest pixel value.

After locating the position of the pixel $Q_{mn}$, the deciding unit 104 calculates a threshold TH for deciding whether the largest value $d_{mn}$ is a small value or a large value. The following equation is used here to calculate the threshold TH:

$$TH = k*d_{ij} \qquad \text{Equation (1)}$$

Symbol $d_{ij}$ in Equation (1) denotes a largest one of pixel values in the map M1, and a coefficient k in Equation (1) is a value set to satisfy 0<k<1. The threshold TH may be calculated according to Equation (1). It should be noted that k of too large or small value may prevent the threshold TH from being set with an appropriate value. Therefore, the value of k is desirably set so that an appropriate threshold TH may be obtained. An example of k may be k=0.5, for example. FIG. 20 shows an example of the threshold TH wherein the coefficient k in Equation (1) is k=0.5.

After calculating the threshold TH, the deciding unit 104 compares the largest value $d_{mn}$ of pixel values in the multiplied map RM1 with the threshold TH to decide whether or not $d_{mn}$<TH. When $d_{mn}$<TH, $d_{mn}$ is decided to be small, while when $d_{mn}$≥TH, $d_{mn}$ is decided to be a large value. In FIG. 20, $d_{mn}$<TH. Therefore, the deciding unit 104 decides that $d_{mn}$ is a small value.

As described earlier, when the temporary position $(x_i, y_j)$ of the aorta in the map M1 lies within the region R1 of the aorta, the pixel values in the multiplied map RM1 have small values. Therefore, when $d_{mn}$<TH, the deciding unit 104 decides that the temporary position $(x_i, y_j)$ of the aorta falls within the region R1 of the aorta. When the temporary position is decided to fall within the region R1 of the aorta, the flow goes to Step ST24. At Step ST24, the determining unit 105 (see FIG. 2) determines the temporary position $(x_i, y_j)$ of the aorta (see FIG. 14) as the position of the aorta A in the axial image $D_1$.

Thus, when the temporary position $(x_i, y_j)$ of the aorta falls within the region of the aorta, the temporary position $(x_i, y_j)$ of the aorta may be determined as an actual position of the aorta.

For the flow of the decision method at Step ST23 wherein the temporary position of the aorta A detected at Step ST22 does not fall within the region of the aorta A (see FIG. 16). At Step ST23a, the deciding unit 104 multiplies the map M2 by the distribution model DM, as described earlier referring to FIG. 19. By multiplying the map M2 by the distribution model DM, a multiplied map RM2 shown in FIG. 19 is obtained.

As described earlier, in the multiplied map RM2, the pixel values in the region R1 of the aorta keep their large values. After obtaining the multiplied map RM2, the flow goes to Step ST23b.

Figure 21:
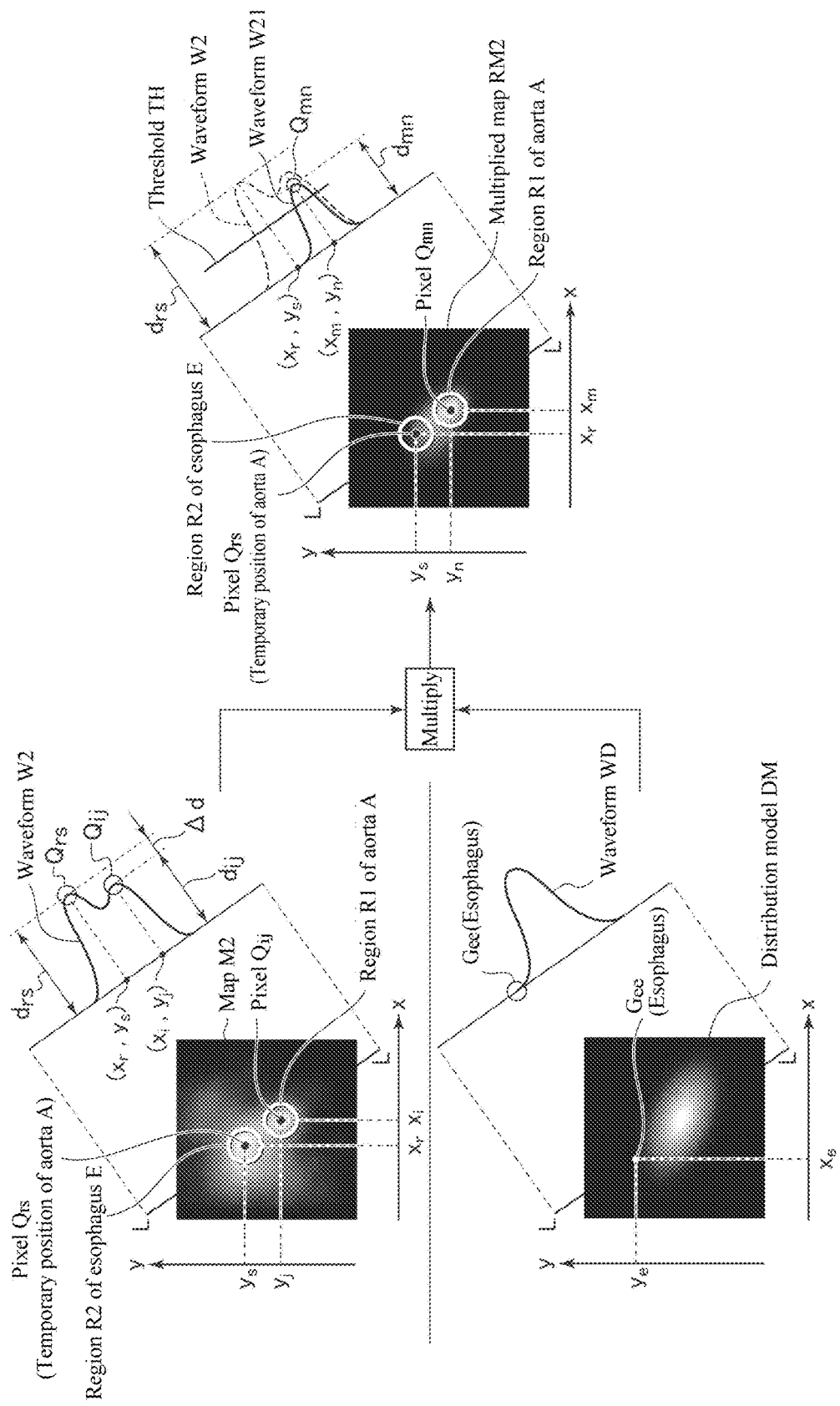
FIG. 21 is a diagram explaining Step ST23b.

FIG. 21 is a diagram explaining Step ST23b. At Step ST23b, first, the deciding unit 104 locates a position of a pixel having a largest pixel value from within the multiplied map RM2. It is assumed here that a pixel $Q_{mn}$ at coordinates $(x_m, y_n)$ has a largest pixel value $d=d_{mn}$. Therefore, the deciding unit 104 identifies the coordinates $(x_m, y_n)$ of the pixel $Q_{mn}$ as the position of a pixel having a largest pixel value.

After locating the position of the pixel $Q_{mn}$, the deciding unit 104 calculates a threshold TH for deciding whether the largest value $d_{mn}$ is small or large. The following equation is used here to calculate the threshold TH:

$$TH = k*d_{rs} \qquad \text{Equation (2)}$$

Symbol $d_{rs}$ in Equation (2) denotes a largest one of pixel values in the map M2, and a coefficient k in Equation (2) is a value set to satisfy 0<k<1. The threshold TH may be calculated according to Equation (2). An example of k may be k=0.5, for example. FIG. 21 shows an example of the threshold TH wherein the coefficient k in Equation (2) is k=0.5.

After calculating the threshold TH, the deciding unit 104 compares the largest value $d_{mn}$ of pixel values in the multiplied map RM2 with the threshold TH to decide whether or not $d_{mn}$<TH. In FIG. 21, $d_{mn}$>TH. Therefore, the deciding unit 104 decides that the $d_{mn}$ is a large value.

As described earlier, when the temporary position $(x_i, y_j)$ of the aorta in the map M2 does not lie within the region R1 of the aorta, the pixel values in the region R1 of the aorta in the multiplied map RM2 keep their large values. Therefore, when $d_{mn}$>TH, the deciding unit 104 decides that the temporary position $(x_i, y_j)$ of the aorta does not fall within the region R1 of the aorta. When the temporary position is decided not to fall within the region R1 of the aorta, the flow goes to Step ST25.

Figure 22:
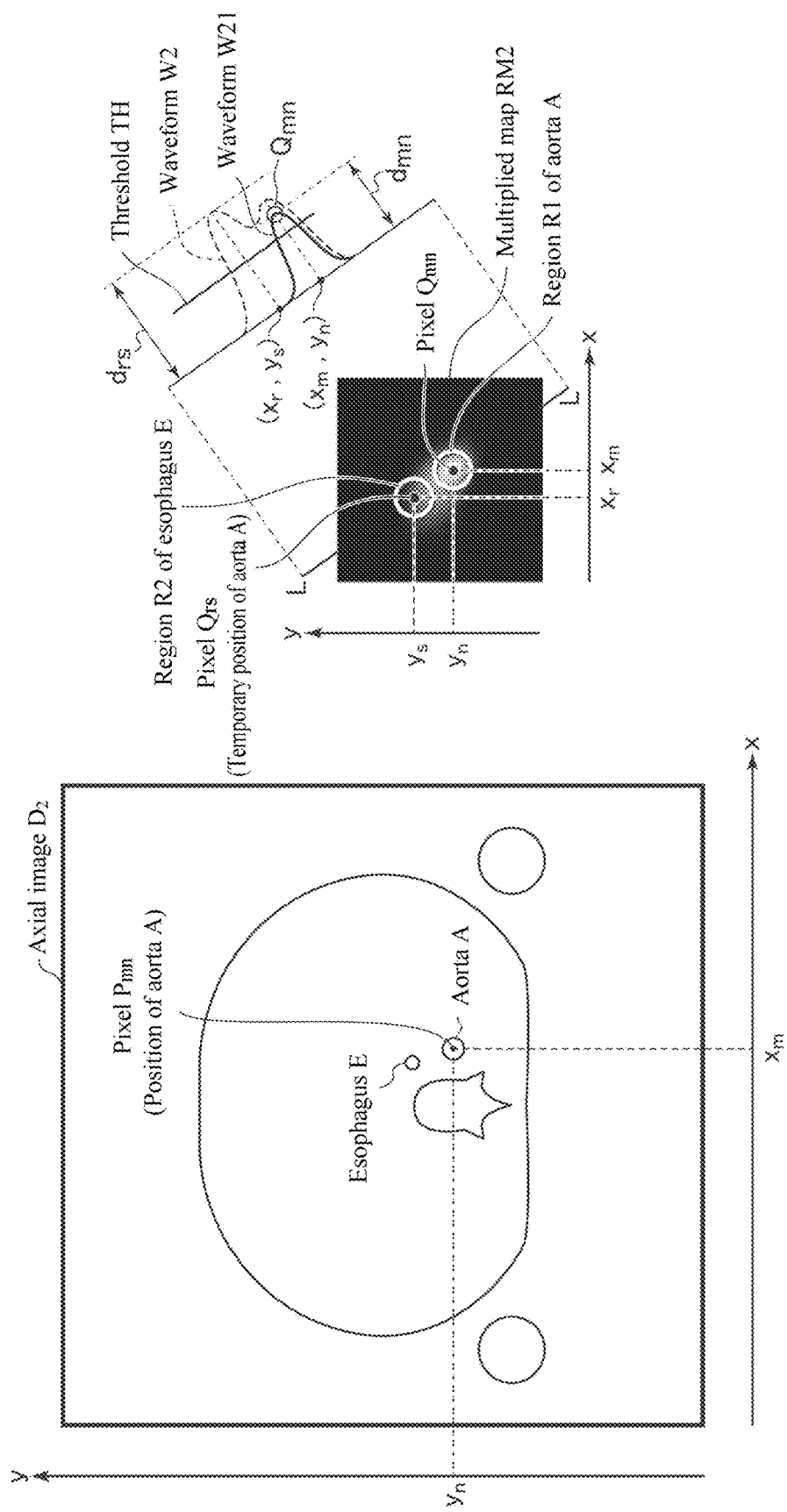
FIG. 22 is a diagram explaining a process of determining a position of the aorta based on the multiplied map RM2.

At Step ST25, the determining unit 105 determines the position of the aorta based on the multiplied map RM2 (see FIG. 22).

FIG. 22 is a diagram explaining a process of determining a position of the aorta based on the multiplied map RM2. As described above, when the temporary position of the aorta does not fall within the region R1 of the aorta, pixel values in the region R1 of the aorta in the multiplied map RM2 keep their large values. Accordingly, when the temporary position of the aorta is decided not to fall within the region R1 of the aorta, the determining unit 105 determines the coordinates $(x_m, y_n)$ of the pixel $Q_{mn}$ having a largest pixel value $d_{mn}$ in the multiplied map RM2 as the position of the aorta.

Thus, even when the temporary position $(x_i, y_j)$ of the aorta does not fall within the region of the aorta, the position $(x_m, y_n)$ of the aorta may be determined.

Figure 23:
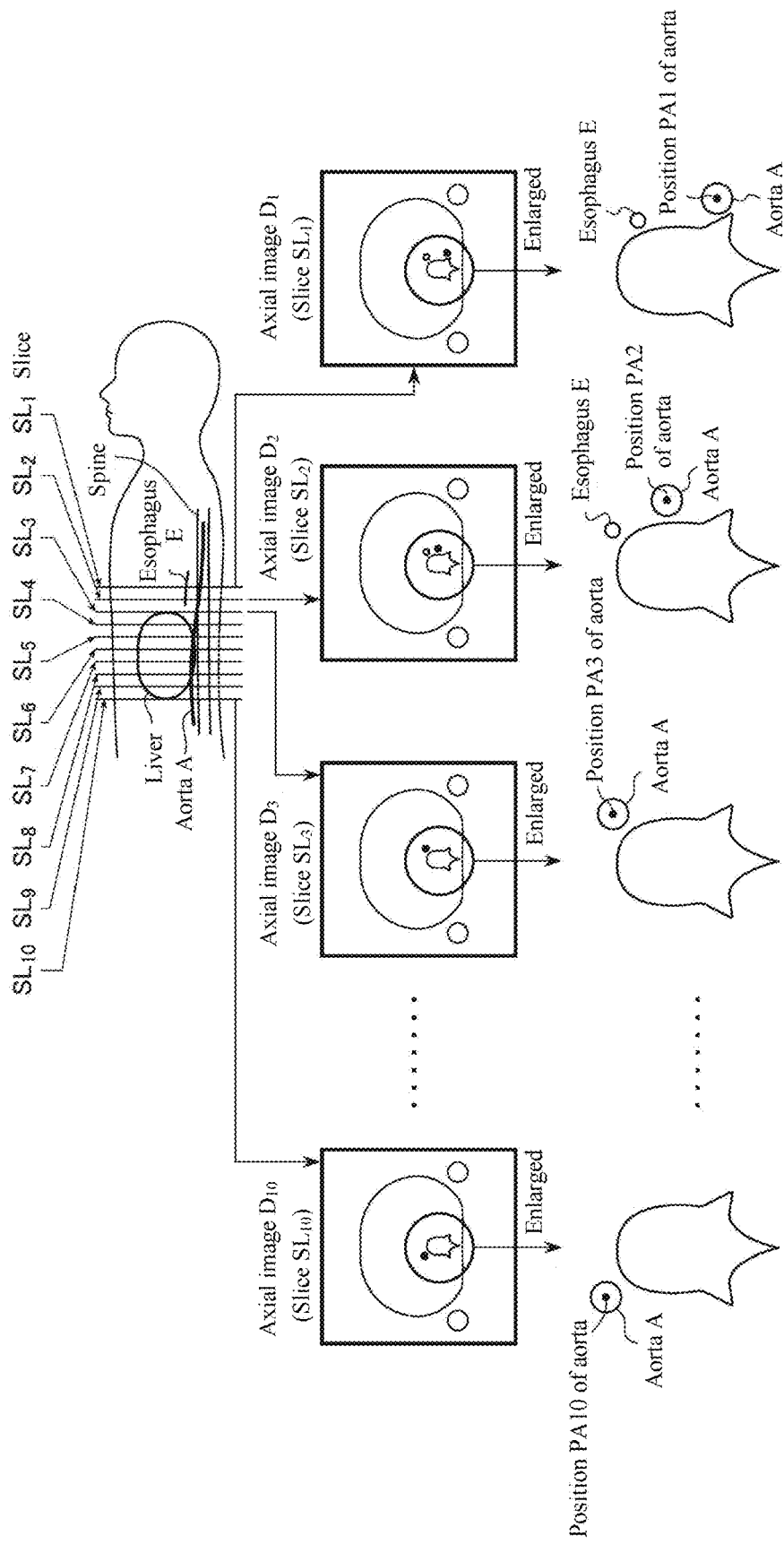
FIG. 23 is a diagram schematically showing positions PA1 to PA10 of the aorta determined by Step ST2 respectively for axial images $D_1$ to $D_{10}$.

In the present embodiment, Step ST2 is performed for each of the axial images $D_1$ to $D_{10}$. Therefore, the position of the aorta may be determined for each axial image. FIG. 23 schematically shows positions PA1 to PA10 of the aorta located according to Step ST2 respectively for the axial images $D_1$ to $D_{10}$. After locating the position of the aorta in each of the axial images $D_1$ to $D_{10}$, the flow goes to Step ST3.

At Step ST3, the plane calculating unit 106 (see FIG. 2) calculates a plane longitudinally cutting the aorta based on the positions PA1 to PA10 of the aorta A detected from the slice $SL_1$ to $SL_{10}$. Now a method of calculating the plane will be described below.

First, the plane calculating unit 106 locates a region of the cross section of the aorta for each axial image based on the positions PA1 to PA10 of the aorta. A segmentation technique such as a Level Set method may be used as a method of locating a region of the cross section of the aorta. After locating the region of the cross section of the aorta, a center of the cross section of the aorta is found. Since the cross section of the aorta A may be considered to have a generally circular shape, the center of the aorta A may be found by regarding the located region as a circle.

Figure 24:
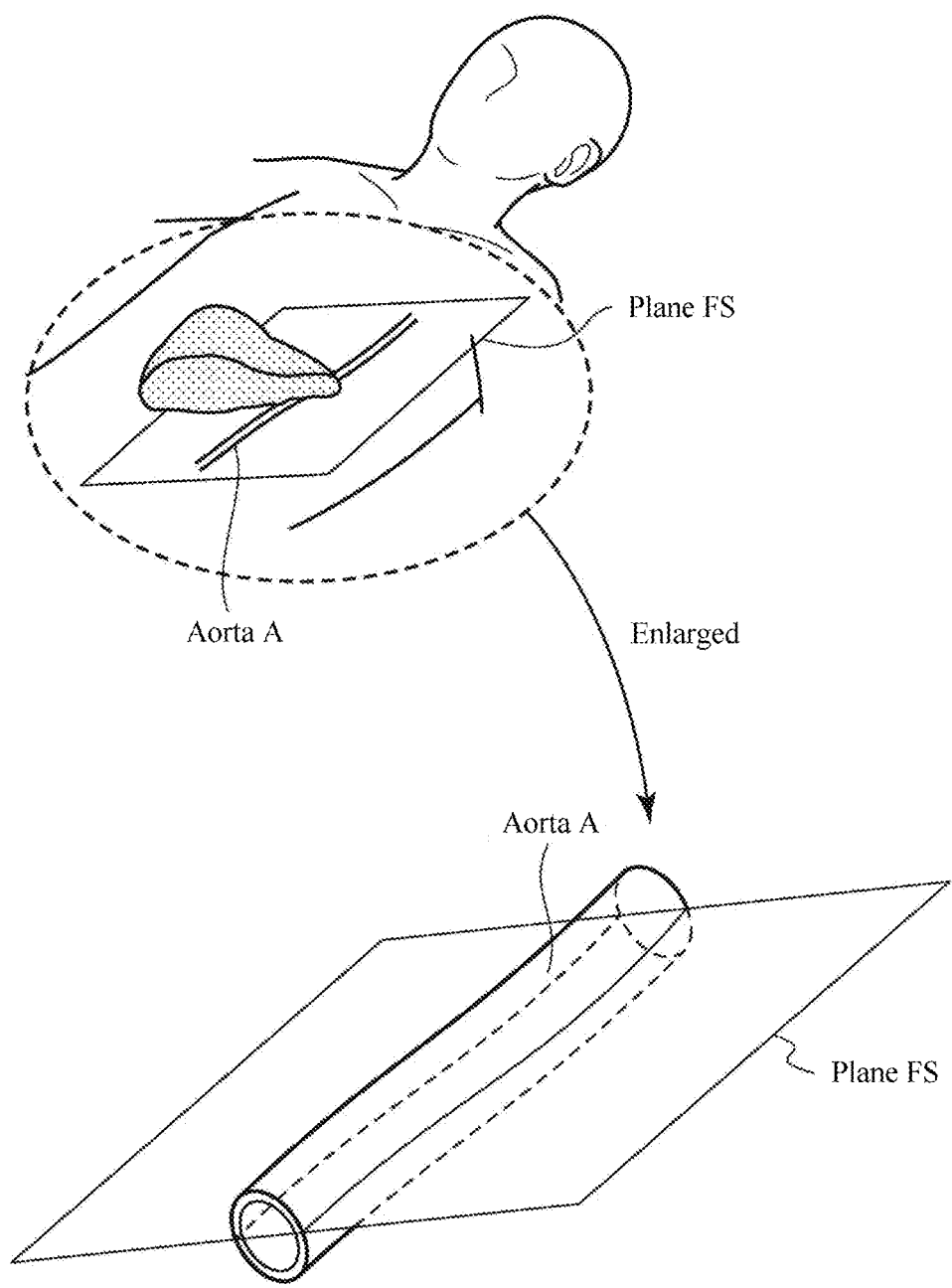
FIG. 24 is a diagram schematically showing a plane FS.

After finding the center of the aorta A, the plane calculating unit 106 calculates such a plane that a squared sum of a distance between the position the center of the aorta and the plane is minimized. FIG. 24 schematically shows a determined plane FS. The plane FS longitudinally cuts the aorta generally in parallel with a direction of the course of the aorta. After determining the plane FS, the flow goes to Step ST4.

At Step ST4, a tracker region for detecting the contrast medium is defined. Now a method of defining a tracker region will be described below.

Figure 25:
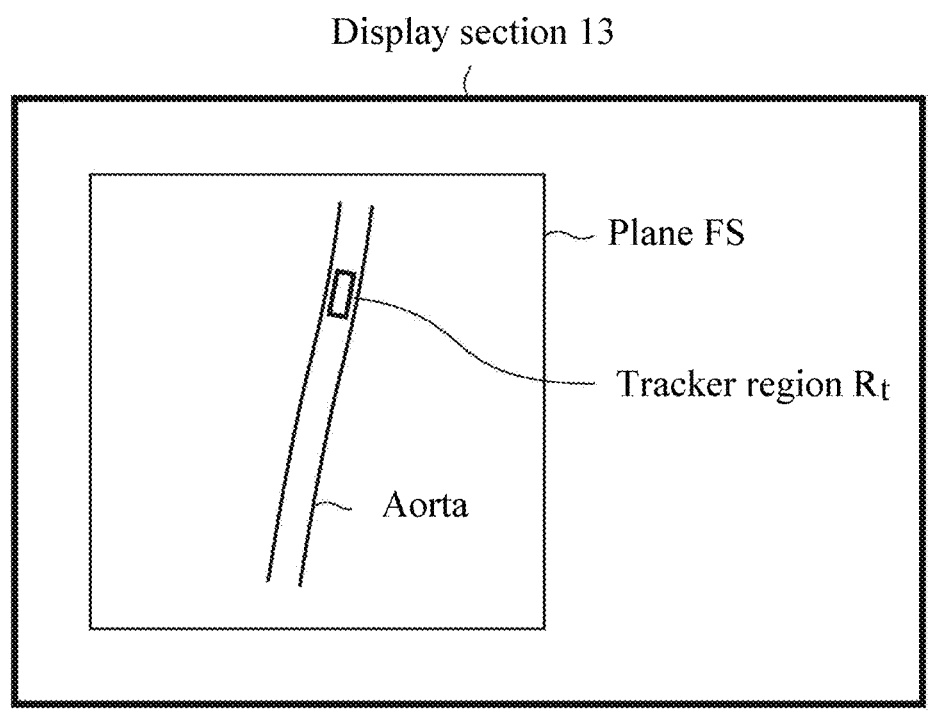
FIG. 25 is a diagram explaining an exemplary method of defining a tracker region.

FIG. 25 is a diagram explaining an exemplary method of defining a tracker region. The operator operates the operating section 12 (see FIG. 1) to input a command for displaying the plane FS determined at Step ST3 in the display section 13. Once the command has been input, the plane FS determined at Step ST3 is displayed in the display section 13.

After the plane FS is displayed, the operator operates the operating section 12 to input information for defining a tracker region while referring to a positional relationship among organs and the aorta displayed in the plane FS. Once the information has been input, the defining unit 107 (see FIG. 2) defines a tracker region based on the input information. FIG. 25 shows a case in which a tracker region $R_t$ is defined to lie in the inside of the aorta A. It should be noted that the tracker region $R_t$ may be automatically defined based on the position of the aorta A. After defining the tracker region $R_t$, the flow goes to Step ST5.

At Step ST5, a main scan MS (see FIG. 3) is performed. In the main scan MS, the subject is injected with the contrast medium, and a sequence for detecting the contrast medium from the tracker region $R_t$ is repetitively performed. Once a predefined amount of the contrast medium has been injected in the tracker region $R_t$, a scan for obtaining an image of the liver is performed, and the flow is terminated.

In the present embodiment, a temporary position of the aorta is determined, and then, a distribution model DM is used to generate a multiplied map. A pixel value in the multiplied map is then compared with a threshold TH to decide whether or not the temporary position of the aorta falls within a region of the aorta. When the pixel values in the multiplied map are small, the temporary position of the aorta is decided to fall within the region of the aorta, which proves that the position of the aorta is successfully and correctly detected. On the other hand, when the pixel values in the multiplied map are large, the temporary position of the aorta is decided not to fall within the region of the aorta, which proves that the position of the aorta is wrongly detected. When the position of the aorta is wrongly detected, the position of the aorta may be determined from within the region R1 of the aorta based on the pixel values in the multiplied map. Therefore, by using the distribution model DM to obtain a multiplied map, a correct position of the aorta may be located even when the position of the aorta is wrongly detected.

The present embodiment shows a case in which the esophagus is wrongly detected as an aorta. The present invention, however, may be applied to a case in which an organ, a physical apparatus, or a tissue other than the esophagus is wrongly detected as an aorta. Moreover, while the present embodiment detects the aorta A, the present invention may be applied to a case in which a temporary position of an organ, a physical apparatus, or a tissue other than the aorta A (a temporary position of a vein, for example) is detected.

In the present embodiment, a localizer scan is a 2D scan for obtaining an axial image for each slice. The localizer scan, however, is not limited to the 2D scan, and may be a 3D scan for obtaining a 3D image of a body part to be imaged. From the 3D image of the body part to be imaged obtained by the 3D scan, an axial image at each slice position may be produced, and the processing of determining a position of the aorta may be executed based on these axial images.

While the present embodiment detects a temporary position of the aorta based on an axial image, the temporary position of the aorta may be detected based on an image in a plane other than the axial plane (for example, an oblique plane intersecting the axial plane at an angle).

While in the present embodiment the window W is rectangular, it may have a different shape (an elliptical shape, for example).

The present embodiment addresses a case in which a subject is imaged using a contrast medium. The present invention, however, may be applied to a case in which non-contrast enhanced imaging using no contrast enhancement is performed, insofar as there is a need for determining a temporary position of a body part of interest based on data obtained by imaging, and deciding whether or not the determined temporary position falls within a region of the body part of interest.

While the present embodiment is described with reference to images obtained by an MR apparatus, the present invention may be applied to images obtained by a medical apparatus different from the MR apparatus (a CT apparatus, for example).

I claim:

1. An image processing apparatus comprising:
   an image producing unit for producing an image of a body part to be imaged including a first body part and a second body part of a subject;
   a map generating unit for generating a first map for locating a region in which a probability that said first body part lies is high in said image;
   a unit for determining a temporary position of said first body part based on said first map;
   a deciding unit for making a decision on whether or not the temporary position of said first body part falls within the region of said first body part in said image based on a model containing information representing a reference position of said second body part and information representing a range over which said first body part distributes relative to said reference position, and on said first map;
   a plane calculating unit for calculating a plane longitudinally cutting the first body part; and
   a display section for displaying the determined first body part in the plane.

2. The image processing apparatus as recited in claim 1, wherein said deciding unit generates a second map based on said model and said first map, said second map being for making said decision.

3. The image processing apparatus as recited in claim 2, wherein said deciding unit generates said second map by multiplying said model by said first map.

4. The image processing apparatus as recited in claim 3, wherein said deciding unit generates said second map by multiplying said distribution model by said first map so that the reference position of said second body part in said distribution model matches the temporary position of said first body part in said map.

5. The image processing apparatus as recited in claim 2, wherein said deciding unit makes the decision on whether or not the temporary position of said first body part falls within the region of said first body part in said image based on a largest one of pixel values in said second map.

6. The image processing apparatus as recited in claim 5, wherein said deciding unit makes the decision on whether or not the temporary position of said first body part falls within the region of said first body part in said image by calculating a threshold for deciding whether said largest value is a small value or a large value, and comparing said threshold with said largest value, wherein the threshold is calculated based on a pixel value of one of a plurality of pixels included in said first map, and wherein said one of the plurality of pixels included in said first map pixel is at the temporary position of said first body part.

7. The image processing apparatus as recited in claim 1, wherein said first body part includes a blood vessel, and said second body part includes an esophagus.

8. A medical apparatus comprising:
   a scanning section for performing a scan for acquiring data of a body part to be imaged including a first body part and a second body part of a subject;
   an image producing unit for producing an image of said body part to be imaged based on the data acquired by said scan;
   a map generating unit for generating a first map for locating a region in which a probability that said first body part lies is high in said image;
   a unit for determining a temporary position of said first body part based on said first map; and
   a deciding unit for making a decision on whether or not the temporary position of said first body part falls within the region of said first body part in said image based on a model containing information representing a reference position of said second body part and information representing a range over which said first body part distributes relative to said reference position, and on said first map;
   a plane calculating unit for calculating a plane longitudinally cutting the first body part; and
   a display section for displaying the determined first body part in the plane.

9. The medical apparatus as recited in claim 8, wherein said first body part includes a blood vessel, and said second body part includes an esophagus.

10. A magnetic resonance imaging (MRI) method comprising:
    producing an image of a body part including a first body part and a second body part of a subject;
    generating a first map for locating a region in which a probability that the first body part lies is high in the image;
    determining a temporary position of the first body part based on the first map;
    deciding whether the temporary position of the first body part falls within the region of the first body part in the image based on a model and the first map, wherein the model contains information representing a reference position of the second body part and information representing a range over which the first body part distributes relative to the reference position;
    calculating a plane longitudinally cutting the first body part; and
    displaying the determined first body part in the plane.

11. The MRI method as recited in claim 10, wherein deciding whether the temporary position of the first body part falls within the region comprises:
    generating a second map by multiplying the model by the first map;
    comparing a largest pixel value in the second map with a threshold;
    in response to the largest pixel value being smaller than the threshold, deciding that the temporary position falls within the region.

12. The MRI method as recited in claim 11, further comprising:
    in response to the largest pixel value being larger than the threshold, deciding that the temporary position falls outside of the region; and
    determining position of a pixel with the largest pixel value as position of the first body part.

13. The MRI method as recited in claim 10, wherein the first body part includes a blood vessel, and the second body part includes an esophagus.

* * * * *